(12) United States Patent
Lee et al.

(10) Patent No.: US 12,666,850 B2
(45) Date of Patent: Jun. 23, 2026

(54) LIGHT EMITTING DISPLAY DEVICE

(71) Applicant: LG Display Co., Ltd., Seoul (KR)

(72) Inventors: In-Goo Lee, Paju-si (KR); Hyeon-Hye Yu, Paju-si (KR); Won-Sik Lee, Paju-si (KR)

(73) Assignee: LG Display Co. Ltd., Seoul (KR)

( * ) Notice: Subject to any disclaimer, the term of this patent is extended or adjusted under 35 U.S.C. 154(b) by 360 days.

(21) Appl. No.: 18/542,315

(22) Filed: Dec. 15, 2023

(65) Prior Publication Data

US 2024/0224748 A1     Jul. 4, 2024

(30) Foreign Application Priority Data

Dec. 29, 2022    (KR) ........................ 10-2022-0189149

(51) Int. Cl.
*H10K 59/80*          (2023.01)
*H10K 59/122*         (2023.01)
(52) U.S. Cl.
CPC ......... *H10K 59/878* (2023.02); *H10K 59/122* (2023.02)
(58) Field of Classification Search
CPC ... H10K 59/122; H10K 59/124; H10K 59/878
See application file for complete search history.

(56) References Cited

U.S. PATENT DOCUMENTS

| | | | |
|---|---|---|---|
| 2021/0191576 A1* | 6/2021 | Kwon | ................... G06F 3/0448 |
| 2024/0224744 A1* | 7/2024 | Lee | ...................... H10K 59/122 |
| 2024/0224751 A1* | 7/2024 | Lim | ...................... H10K 59/878 |
| 2024/0260416 A1* | 8/2024 | Yu | ........................ H10K 59/878 |
| 2024/0260417 A1* | 8/2024 | Yu | ........................ H10K 59/122 |

* cited by examiner

*Primary Examiner* — Telly D Green
(74) *Attorney, Agent, or Firm* — Seed Intellectual Property Law Group LLP

(57)          ABSTRACT

A light emitting display device includes an inclined reflective portion that is below a bank and disposed in each of a plurality of pixel regions. The device includes a light emitting diode disposed in an opening. Each of the plurality of pixel regions is configured such that the corresponding opening and reflective portion have a cardioid-shaped structure with a cusp. A display region includes a first region of a first PPI and a second region of a second PPI smaller than the first PPI. The pixel region disposed in the first region has a first type cardioid-shaped structure, and the pixel region disposed in the second region has a second type cardioid-shaped structure. The first type cardioid-shaped structure has a smaller rate of change in curvature than the second type cardioid-shaped structure.

9 Claims, 21 Drawing Sheets

<Comparative>

<Embodiment>

<Comparative>

<Embodiment>

LIGHT EMITTING DISPLAY DEVICE

CROSS-REFERENCE TO RELATED APPLICATIONS

The present application claims the priority benefit of Korean Patent Application No. 10-2022-0189149 filed in Republic of Korea on Dec. 29, 2022, which is hereby incorporated by reference in its entirety for all purposes as if fully set forth herein.

BACKGROUND

Technical Field

The present disclosure relates to a light emitting display device.

Description of the Related Art

Recently, flat panel display devices having excellent characteristics such as thinness, light weight, and low power consumption have been widely developed and applied to various fields.

Among the flat panel display devices, a light emitting display device including a light emitting element such as a light emitting diode is a display device in which charges are injected into a light emitting layer formed between an anode and a cathode to form pairs of electrons and holes, and then the pairs disappear to emit light.

BRIEF SUMMARY

The light emitting display device in the related art have a low light efficiency and thus the inventors of the present disclosure have provided various embodiments of a display device that has an improved light efficiency. That is, one of the technical benefits of the present disclosure includes providing a display device that can improve light efficiency.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, a light emitting display device includes: a bank that is on a substrate and includes an opening corresponding to each of a plurality of pixel regions of a display region; an inclined reflective portion that is below the bank and disposed in each of the plurality of pixel regions; and a light emitting diode disposed in the opening, wherein each of the plurality of pixel regions is configured such that the corresponding opening and reflective portion have a cardioid-shaped structure with a cusp, wherein the display region includes a first region of a first PPI (Pixels Per Inch) and a second region of a second PPI smaller than the first PPI, wherein the pixel region disposed in the first region has a first type cardioid-shaped structure, and the pixel region disposed in the second region has a second type cardioid-shaped structure, and wherein the first type cardioid-shaped structure has a smaller rate of change in curvature than the second type cardioid-shaped structure.

In another aspect, a light emitting display device includes: a bank that is on a substrate and includes an opening corresponding to each of a plurality of pixel regions of a display region; an inclined reflective portion that is below the bank and disposed in each of the plurality of pixel regions; and a light emitting diode disposed in the opening, wherein each of the plurality of pixel regions is configured such that the corresponding opening and reflective portion have a cardioid-shaped structure with a cusp, wherein the display region has a shape curved along a direction from one end to the other end thereof, wherein the plurality of pixel regions include a pixel region of a first type cardioid-shaped structure and a pixel region of a second type cardioid-shaped structure whose rate of change in curvature is greater than that of the first type cardioid-shaped structure, and wherein a combination ratio of the pixel region of the first type cardioid-shaped structure and the pixel region of the second type cardioid-shaped structure is differentiated along the direction from the one end to the other end.

In yet another aspect, a light emitting display device includes: a bank that is on a substrate and includes an opening corresponding to each of a plurality of pixel regions of a display region; an inclined reflective portion that is below the bank and disposed in each of the plurality of pixel regions; and a light emitting diode disposed in the opening, wherein each of the plurality of pixel regions is configured such that the corresponding opening and reflective portion have a cardioid-shaped structure with a cusp, wherein the display region includes a flat region, and a curved region outside the flat region, wherein the pixel region disposed in the flat region has a first type cardioid-shaped structure, and the pixel region disposed in the curved region has a second type cardioid-shaped structure, wherein the first type cardioid-shaped structure has a smaller rate of change in curvature than the second type cardioid-shaped structure, and wherein an orientation of the cusp of the cardioid-shaped structure of the curved region is opposite to a direction toward the flat region.

It is to be understood that both the foregoing general description and the following detailed description are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings:

FIGS. 16 and 17 are views schematically illustrating arrangement structures of pixel regions in regions A and B within a display region of FIG. 15, respectively;

DETAILED DESCRIPTION OF THE ILLUSTRATED EMBODIMENTS

Figure 1:
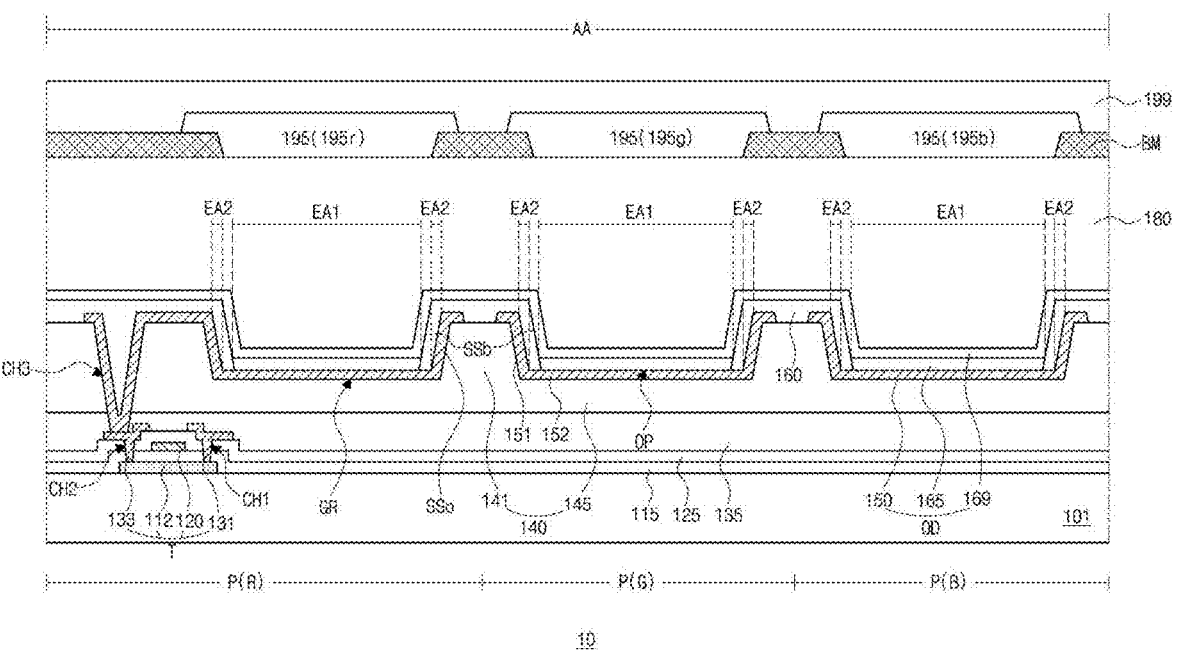
FIG. 1 is a schematic cross-sectional view illustrating a light emitting display device according to a first embodiment of the present disclosure.

Advantages and features of the present disclosure and methods of achieving them will be apparent with reference to the embodiments described below in detail with the accompanying drawings. However, the present disclosure is not limited to the embodiments disclosed below, but can be realized in a variety of different forms, and only these embodiments allow the present disclosure to be complete. The present disclosure is provided to fully inform the scope of the disclosure to the skilled in the art of the present disclosure.

The shapes, sizes, dimensions (e.g., length, width, height, thickness, radius, diameter, area, etc.), proportions, angles, numbers, number of elements, and the like disclosed in the drawings for explaining the embodiments of the present disclosure are illustrative, and the present disclosure is not limited to the illustrated matters. The same reference numerals refer to the same components throughout the description.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

Furthermore, in describing the present disclosure, if it is determined that a detailed description of the related known technology unnecessarily obscure the subject matter of the present disclosure, the detailed description thereof can be omitted. When 'comprising', 'including', 'having', 'consisting', and the like are used in this disclosure, other parts can be added unless 'only' is used. When a component is expressed in the singular, cases including the plural are included unless specific statement is described.

In interpreting the components, even if there is no separate explicit description, it is interpreted as including a margin range.

In the case of a description of a positional relationship, for example, when the positional relationship of two parts is described as 'on', 'over', 'above', 'below', 'beside', 'under', and the like, one or more other parts can be positioned between such two parts unless 'right' or 'directly' is used.

In the case of a description of a temporal relationship, for example, when a temporal precedence is described as 'after', 'following', 'before', and the like, cases that are not continuous can be included unless 'directly' or 'immediately' is used.

In describing components of the present disclosure, terms such as first, second and the like can be used. These terms are only for distinguishing the components from other components, and an essence, order, order, or number of the components is not limited by the terms.

Respective features of various embodiments of the present disclosure can be partially or wholly connected to or combined with each other and can be technically interlocked and driven variously, and respective embodiments can be independently implemented from each other or can be implemented together with a related relationship.

Hereinafter, embodiments of the present disclosure are described in detail with reference to the drawings. Meanwhile, in the following embodiments, the same and like reference numerals are assigned to the same and like components, and detailed descriptions thereof may be omitted.

First Embodiment

Figure 2:
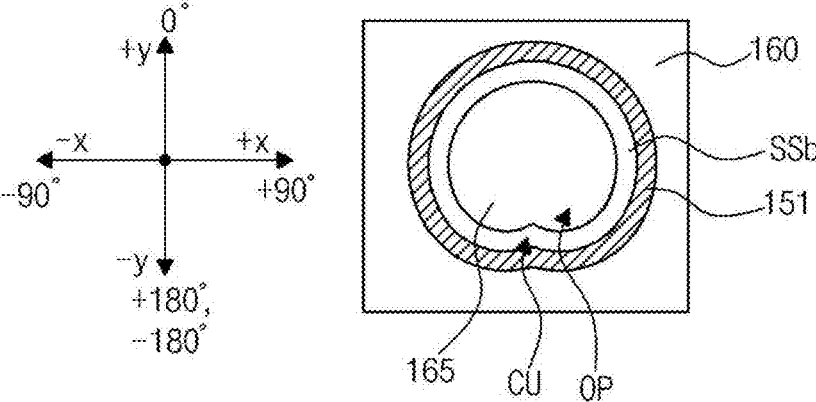
FIGS. 2 to 4 are plan views schematically illustrating a cardioid-shaped light extraction structure of a pixel region according to a first embodiment of the present disclosure.
Figure 3:
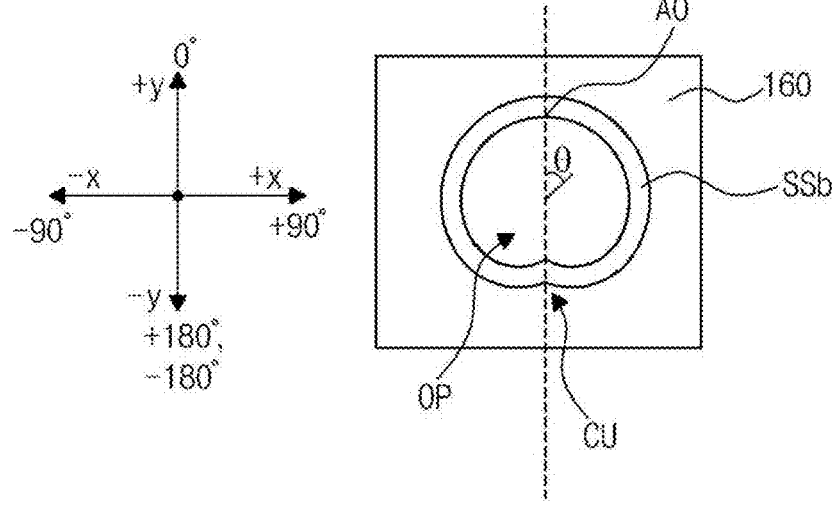
Figure 4:
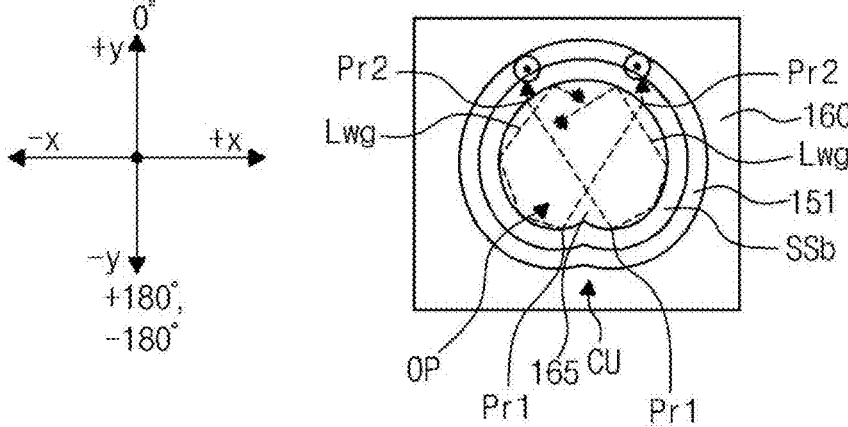

FIG. 1 is a schematic cross-sectional view illustrating a light emitting display device according to a first embodiment of the present disclosure. FIGS. 2 to 4 are plan views schematically illustrating a cardioid-shaped light extraction structure of a pixel region according to a first embodiment of the present disclosure.

Prior to a detailed description, the light emitting display device 10 according to the first embodiment of the present disclosure may include all kinds of display devices including a light emitting diode OD, which is a self-luminescent element, to display an image.

In this embodiment, for convenience of description, an organic light emitting display device is taken as the light emitting display device 10 as an example.

Referring to FIG. 1, the light emitting display device 10 of this embodiment may be a top emission type display device that displays an image by outputting light toward an upper side of a substrate 101.

On the substrate 101 of the light emitting display device 10, a plurality of pixel regions P may be arranged in a matrix form along a plurality of row lines and a plurality of column lines in a display region AA displaying an image. Meanwhile, although not shown in the drawings, a plurality of gate lines extending in a row direction and a plurality of data lines extending in a column direction may be formed on the substrate 101. Each pixel region P may be connected to corresponding gate line and data line.

The plurality of pixel regions P may include pixel regions of different colors constituting a unit pixel displaying a color image, for example, red (R), green (G), and blue (B) pixel regions P respectively displaying red (R), green (G), and blue (B).

In each pixel region P, a plurality of thin film transistors, at least one capacitor, and a light emitting diode OD may be formed on the substrate 101. Meanwhile, in FIG. 1, for convenience of description, one thin film transistor T, for example, a driving thin film transistor T disposed in the red (R) pixel region P is shown.

In more detail, a semiconductor layer 112 may be formed on an inner surface of the substrate 101. In this case, the semiconductor layer 112 may be made of amorphous silicon, polycrystalline silicon, or an oxide semiconductor material, but is not limited thereto.

The semiconductor layer 112 may include a central channel region and source and drain regions on both sides of the channel region.

A gate insulating layer 115 as an insulating layer made of an insulating material may be formed on the semiconductor layer 112. The gate insulating layer 115 may be formed of an inorganic insulating material such as silicon oxide or silicon nitride, but is not limited thereto.

A gate electrode 120 made of a conductive material such as metal may be formed on the gate insulating layer 115 to correspond to the channel region of the semiconductor layer 112.

In addition, a gate line connected to a gate electrode of a switching thin film transistor (not shown) may be formed on the gate insulating layer 115.

A first interlayered insulating layer 125 as an insulating layer made of an insulating material may be formed on the gate electrode 120 and over the entire surface of the substrate 101.

The first interlayered insulating layer 125 may be formed of an inorganic insulating material such as silicon oxide or silicon nitride, or may be formed of an organic insulating material such as benzocyclobutene or photo acryl, but is not limited thereto.

In the first interlayered insulating layer 125 and the gate insulating layer 115 below the first interlayer insulating layer 125, a first contact hole CH1 and a second contact hole CH2 respectively exposing the source region and the drain region of the semiconductor layer 112 may be provided.

The first contact hole CH1 and the second contact hole CH2 may be disposed on both sides of the gate electrode 120 and be spaced apart from the gate electrode 120.

A source electrode 131 and a drain electrode 133 made of a conductive material such as metal may be formed on the first interlayered insulating layer 125.

In addition, on the first interlayer insulating layer 125, a data line that crosses the gate line and is connected to the source electrode of the switching thin film transistor may be formed.

The source electrode 131 and the drain electrode 133 may be spaced apart from each other with the gate electrode 120 therebetween, and may contact the source region and the drain region of the semiconductor layer 112 through the first contact hole CH1 and the second contact hole CH2, respectively.

The semiconductor layer 112, the gate electrode 120, the source electrode 131, and the drain electrode 133, configured as above, may constitute the thin film transistor T.

As another example, the thin film transistor T may have an inverted staggered structure in which the gate electrode 120 is located below the semiconductor layer 112 and the source electrode 131 and the drain electrode 133 are located on the semiconductor layer 112.

A second interlayered insulating layer 135 as an insulating layer made of an insulating material may be formed on the source electrode 131 and the drain electrode 133 and over the entire surface of the substrate 101.

The second interlayered insulating layer 135 may be formed of an inorganic insulating material such as silicon oxide or silicon nitride, but is not limited thereto.

An overcoat layer (or planarization layer) 140 may be formed on the second interlayered insulating layer 135. The overcoat layer 140 may be formed of an organic insulating material such as benzocyclobutene or photo acryl, but is not limited thereto.

A third contact hole (or drain contact hole) CH3 exposing the drain electrode 133 may be formed in the overcoat layer 140 and the second interlayered insulating layer 135.

The overcoat layer 140 may include protruding portions (or separation walls) 141 protruding upward along a boundary (or edge) of each pixel region P. Accordingly, the overcoat layer 140 may be formed with concave grooves GR defined inside the protruding portions 141 by the protruding portions 141. Meanwhile, a portion of the overcoat layer 140 positioned below the concave groove GR (or below a bottom surface of the concave groove GR) may have a top surface (or upper surface) thereof which is substantially flat and be referred to as a flat portion (or base portion) 145.

The protruding portion 141 may be configured to have a tapered shape in which a width thereof narrows in an upward direction which is a light emission direction. Accordingly, the protruding portion 141 may be configured with a side surface SSo thereof as an inclined surface SSo. In this regard, the inclined surface SSo of the protruding portion 141 may be configured to have a shape inclined at a certain angle in an outward direction based on the corresponding pixel region P.

The inclined surface SSo may surround the concave groove GR to define the concave groove GR. Accordingly, it can be seen that the concave groove GR has an inclined side surface (or outer circumferential surface) corresponding to the inclined surface SSo.

A first electrode (or anode) 150 may be formed on the overcoat layer 140 in each pixel region P.

The first electrode 150 of each pixel region P may be positioned to correspond to each concave groove GR of the overcoat layer 140, and may have a structure separated from the first electrode 150 of a neighboring pixel region P with the protruding portion 141 interposed therebetween. For example, neighboring first electrodes 150 may be spaced apart from each other on the upper surface of the protruding portion 141.

The first electrode 150 may include a metal material with high reflectance. For example, the first electrode 150 may include Al, Ag, Ti, or an Al—Pd—Cu (APC) alloy, but is not limited thereto.

Meanwhile, the first electrode 150 may have a single-layered structure or a multi-layered structure. When formed in a multi-layered structure, for example, the first electrode may have a laminated structure of Al and Ti (e.g., Ti/Al/Ti), a laminated structure of Al and ITO (e.g., ITO/Al/ITO), a laminated structure of an APC alloy and ITO (e.g., ITO/APC/ITO), etc., but is not limited thereto.

The first electrode 150 may include a reflective portion (or inclined portion) 151 formed along the inclined surface SSo of the overcoat layer 140. The reflective portion 151 may have a shape extending obliquely upward along the inclined surface SSo from the end of the portion of the first electrode 150 positioned on the flat portion 145 of the overcoat layer 140. The portion of the first electrode 150 positioned on the flat portion 145 of the overcoat layer 140 may be referred to as a flat portion (or base portion) 152 of the first electrode.

A bank 160 may be formed on the first electrode 150 to cover an edge of the first electrode 150. The bank 160 may be disposed along the boundary of the pixel region P, and may cover the edge portion including the reflective portion 151 of the first electrode 150 and cover the protruding portion 141 of the overcoat layer 140.

The bank 160 may be formed of, for example, at least one of acrylic resin, epoxy resin, phenol resin, polyamide resin, polyimide resin, unsaturated polyester resin, polyphenylene resin, polyphenylene sulfide resin, benzocyclobutene and photoresist, but is not limited thereto.

The bank 160 may have an opening OP therein exposing the first electrode 150 of each pixel region P.

The bank 160 may be formed in substantially the same shape as (or a shape corresponding to) the overcoat layer 140.

In this regard, the bank 160 may be configured to have a tapered shape with a width being narrower in an upward direction. The tapered shape of the bank 160 may be the same as that of the protruding portion 141 of the overcoat layer 140 positioned therebelow.

Accordingly, the bank 160 may be configured such that its side surface is an inclined surface SSb. The inclined surface SSb of the bank 160 may have substantially the same inclination angle as the inclined surface SSo of the protrusion 141 located therebelow.

The inclined surface SSb of the bank 160 may surround the opening OP. Accordingly, it can be seen that the opening OP has an inclined side surface (or outer circumferential surface) corresponding to the inclined surface SSb.

The opening OP may expose the flat portion 152 of the first electrode 150. More specifically, the bank 160 may be configured to cover the edge of the flat portion 152 of the first electrode 150, and the opening OP may expose a portion of the flat portion 152 except for the edge of the flat portion 152.

An emission layer 165 may be formed on the first electrode 150 of each pixel region P. The emission layer 165 may contact the first electrode 150 exposed through the opening OP of the bank 160.

The emission layer 165 may be formed separately in each pixel region P or may be formed continuously along the entire surface of the substrate 101 to correspond to all pixel regions P. In this embodiment, for convenience of explanation, a case in which the emission layer 165 is formed in each pixel region P is taken as an example.

All of the emission layers 165 in respective pixel regions P may be formed of white emission layer emitting white light. As another example, the emission layer 165 of each pixel region P may be formed of an emission layer emitting the color of its pixel region P, for example, red (R), green (G), and blue (B) pixel regions P may respectively have red (R), green (G), and blue (B) emission layers.

A second electrode (or cathode) 169 may be formed on the emission layer 165 and over the entire surface of the substrate 101.

The second electrode 169 may be formed of a transparent electrode having a transparent property, and in this case, the second electrode 169 may be formed of a transparent conductive material such as ITO.

Meanwhile, in a case of realizing a micro cavity effect in a vertical direction, the second electrode 169 may be configured to include a semi-transparent (or semi-transmissive) electrode layer having a semi-transparent property, and may have a multi-layered structure including the semi-transparent electrode layer. The semi-transparent electrode layer of the second electrode 169 may be formed of, but not limited to, for example, a metal material such as magnesium (Mg), silver (Ag), or an alloy (MgAg) of magnesium (Mg) and silver (Ag), and such the metal material may be formed with a thickness thin enough to realize semi-transparent property.

The first electrode 150, the emission layer 165, and the second electrode 169 arranged as described above in the pixel region P may constitute the light emitting diode OD.

The light emitting diode OD may emit light from the emission layer 165 interposed between the first and second electrodes 150 and 169, and the emitted light may proceed upward and be output.

Meanwhile, some of the light generated from the emission layer 165 may propagate while being totally reflected in the lateral direction (or horizontal direction) of the pixel region P and may be trapped inside the display device. The so-called waveguide mode light traveling in the lateral direction may be reflected by the reflective portion 151 of the first electrode 150 disposed in the lateral direction of the light emitting diode OD and then emitted upward. As such, the reflective portion 151 of the first electrode 150 may function as a mirror for reflecting light traveling in a lateral direction upward.

Due to the reflective portion 151 of the first electrode 150, light extraction efficiency of the light emitting display device 10 may be increased.

A region corresponding to the first electrode 150 exposed by the opening OP may be an effective (or substantial) emission region in which the light emitting diode OD is disposed to generate light, and this region may be referred to as a first emission region (or main emission region) EA1. Further, a region where the reflective portion 151 is disposed may be a so-called reflective emission region in which light generated in the emission layer 165 located inside the region and then propagated in the lateral direction is reflected and emitted upward, and this region may be referred to as a second emission region (or sub emission region) EA2.

It can be seen that each pixel region P has an emission region including the first emission region EA1 and the second emission region EA2. The first emission region EA1 may substantially correspond to a shape of the region corresponding to the first electrode 150 exposed through the opening OP, and the second emission region EA2 may have a shape that is at least partially spaced from the first emission region EA1 (e.g., the spaced region may be referred to as a first non-emission region) and surrounds the first emission region EA1. However, the second emission region EA2 may have a discontinuous band shape in which a section of a cusp (CU of FIG. 2) of a cardioid-shaped structure is in a black state or in a low luminance state.

An encapsulation layer 180 may be formed on the second electrode 169. The encapsulation layer 180 may serve to prevent oxygen or moisture from permeating into the light emitting diode OD.

The encapsulation layer 180 may include, for example, at least one inorganic layer and at least one organic layer. Although not specifically shown, for example, the encapsulation layer 180 may have a structure in which a first inorganic layer, an organic layer on the first inorganic layer, and a second inorganic film on the organic layer are stacked.

A black matrix BM and a color filter layer 195 may be disposed on the encapsulation layer 180.

In this regard, the black matrix BM may be formed to correspond to an edge of each pixel region P.

The color filter layer 195 may be formed to correspond to each pixel region P. The color filter layer 195 may include red, green, and blue color filters 195*r*, 195*g*, and 195*b* respectively corresponding to the red (R), green (G), and blue (B) pixel regions P.

By disposing the color filters 195*r*, 195*g*, and 195*b* in the corresponding pixel regions P, a color purity of light emitted from the corresponding pixel regions P can be improved.

An overcoat film 199 may be formed on the black matrix BM and the color filter layer 195 to cover and protect them. The substrate having the overcoat film 199 may have a substantially flat surface.

Meanwhile, in the light emitting display device 10 of this as described above, in order to increase or maximize light extraction efficiency, the opening OP (or its inclined surface SSb) of the bank 160 and the reflective portion 151 may be formed in the so-called cardioid-shaped (or heart-shaped) structure.

The terms cardioid-shaped or "type of a cardioid-shaped" are used in both the specification and the claims in their broadest meaning to indicate and include any structure that is generally rounded with an indent, depression, cusp (or dimple) in one location, including also any generally heart shaped structures. The curvature, width and depth of the indent can be any angle or size and is not restricted to any exact relative values compared to the curvature of the shape as a whole and the basic cardioid structure can be generally a circle, an ellipse or other generally rounded or curving structure.

When the opening OP of the bank 160 is formed in the cardioid-shaped structure, a whispering gallery mode light, which is a waveguide light that is continuously totally reflected along the interface between the emission layer 165 and the bank 160 (or its inclined surface SSb) and thus is not output and is trapped in the emission layer 165, can be extracted and utilized. Accordingly, light extraction efficiency can be increased or maximized.

The light extraction of the cardioid-shaped structure is described in more detail.

Referring to FIGS. 2 and 3 along with FIG. 1, the opening OP (or the inclined surface SSb) of the bank 160 of this embodiment may be formed in the cardioid shape, which is an asymmetric shape, when viewed in plan. Accordingly, the light emitting diode OD located within the opening OP may also be formed to have the cardioid shape.

In addition, the concave groove GR of the overcoat layer 140 (or the inclined surface SSo of the protruding portion 141) and the reflective portion 151 of the first electrode 150 may also be formed in the cardioid shape substantially the same as the bank 160.

In this regard, when the concave groove GR of the overcoat layer 140 is formed in the cardioid shape, the reflective portion 151 formed along the inclined surface SSo defining the concave groove GR may also be formed in the cardioid shape, and the opening OP of the bank 160 covering the reflective portion 151 may also be formed in the cardioid shape.

Moreover, the emission layer 165 (or light emitting diode OD) located in the opening OP of the bank 160 may also have the side surface (or outer circumferential surface) of the cardioid shape.

The cardioid-shaped structure of the above components is described using the cardioid-shaped structure of the bank 160 shown in FIG. 3 as a representative example.

In FIG. 3, for convenience of explanation, a +y direction, which is an upward direction in the drawing, is set to an azimuth angle θ of 0 degrees, and a −y direction, which is a downward direction in the drawing, is set to an azimuth angle θ of +180 degrees or −180 degrees. At this time, it is assumed that based on an azimuth angle θ of 0 degrees, the azimuth angle θ increases to +180 degrees in a clockwise direction (i.e., in a right circumferential direction in the drawing), and the azimuth angle θ decreases to −180 degrees in a counterclockwise direction (i.e., in a left circumferential direction in the drawing) (or an absolute value of the azimuth angle θ increases to 180 degrees in the counter-clockwise direction).

Here, the cardioid-shaped structure of the bank 160 has the cusp CU of a pointed shape toward the inside of the opening OP, and the cusp CU is set to be located at, for example, the azimuth angle of the −y direction, +180 degrees or −180 degrees.

In this case, as the azimuth angle θ increases clockwise from a 0-degree azimuth angle point A0 to the cusp (CU) point (i.e., from 0 degrees to +180 degrees), a curvature increases continuously (or a radius decreases continuously) to form a curved surface shape that is roughly convex to the right. In addition, as the azimuth angle θ decreases counterclockwise from the 0-degree azimuth angle point A0 to the cusp (CU) point (i.e., from 0 degrees to −180 degrees), a curvature increases continuously (or a radius decreases continuously) to form a curved surface shape that is convex to the left.

In other words, based on the cusp CU, a curved surface shape is formed in which a curvature continuously decreases (or a radius continuously increases) from the cusp CU to the portion A0 located opposite to the cusp CU.

The shape (or planar shape) of such the cardioid-shaped structure may be defined according to an equation 1 below.

$$r = r0 * (1 + \varepsilon * \cos(\theta/2)). \qquad \text{Equation 1}$$

The equation 1 is an equation that defines the radius r of the curved surface of the cardioid-shaped structure according to the azimuth angle θ, where r0 is the radius (i.e., the minimum radius) at the cusp CU where the azimuth angle is +180 or −180 degrees, and ε is a deformation parameter.

Accordingly, a rate of change in curvature of the cardioid-shaped structure can be determined by the deformation parameter ε, thereby determining its form. In this regard, for example, as the deformation parameter ε increases, the rate of change in curvature of the cardioid-shaped structure increases, and accordingly, the cusp (CU) portion of the cardioid-shaped structure becomes sharper. As such, as the deformation parameter ε increases, an asymmetry of the cardioid-shaped structure increases, so that a distribution range of extracted light through the cardioid-shaped structure can be narrowed, and condensing characteristics of the extracted light can be increased.

The bank 160 may be configured in the above cardioid-shaped structure. In this regard, when viewed in plan, the opening OP (or inclined surface SSb) of the bank 160 may be configured in the cardioid-shaped structure with the curved surface shape which has the cusp CU as a transition point of curvature, and whose curvature decreases along the circumferential direction based on the cusp CU.

Since the bank 160 is formed in the asymmetric cardioid-shaped structure, its width may be differentiated depending on a location. For example, regarding widths that each are a distance from each of points with azimuth angles of 0 degrees, 45 degrees, 90 degrees, and 120 degrees to each of points on opposite sides, the width at the point with the azimuth angle of 0 degrees is the smallest one (e.g., 2.50 um), the width at the point with the azimuth angle of 45 degrees is next one (e.g., 2.65 um), the width at the point with the azimuth angle of 120 degrees is next one (e.g., 2.68 um), and the width at the point with the azimuth angle of 90 degrees is the largest one (e.g., 2.71 um). As such, by being formed in the cardioid-shaped structure, the bank 160 can be differentiated in width by location (or by azimuth).

Meanwhile, like the cardioid-shaped structure of the bank 160, the concave groove GR (or the inclined surface SSo) of the overcoat layer 140 and the reflective portion 151 of the first electrode 150 may also be configured in the cardioid-shaped structure with the cusp CU.

As described above, by forming the bank 160 in the asymmetric cardioid-shaped structure, due to its morphological characteristics, the waveguide light that is totally reflected along the interface between the bank 160 and the emission layer 165 can be easily extracted.

This is described with reference to FIG. 4. FIG. 4 is a view schematically illustrating a waveguide light extraction mechanism using a cardioid-shaped structure according to a first embodiment of the present disclosure.

Referring to FIG. 4, some light Lwg of light generated in the emission layer 165 and traveling in the horizontal direction is incident on the interface between the emission layer 165 and the bank 160 at an angle greater than a total reflection critical angle and may be guided along the interface.

However, according to this embodiment, since the bank 160 is formed in the cardioid-shaped structure, the curvature of the interface between the bank 160 and the emission layer 165 increases toward the cusp CU.

Due to the morphological characteristics of this cardioid-shaped structure, the light Lwg guided along the interface may drastically change its path near (or around) the pointed-shaped cusp CU. In this regard, the light Lwg is reflected near the cusp CU with a large curvature and then proceeds to a point Pr2 substantially opposite to the reflection point Pr1, that is, the point Pr2 located in front of the cusp CU.

As such, the waveguide light Lwg incident on the point Pr2 in front of the cusp CU may have an incident angle smaller than the total reflection critical angle due to the sudden path change.

Accordingly, the waveguide light Lwg can pass through (i.e., pass through while being refracted) the interface of the point Pr2 in front of the cusp CU.

The waveguide light Lwg extracted through the interface in this way is reflected by the inclined reflective portion 151 located in its proceeding direction, and then travels toward a top of the light emitting display device 10, and thus can be output to the outside.

As above, since the cardioid-shaped structure has the cusp CU which is a curvature transition point, it has chaotic characteristics that rapidly change the optical path. Accordingly, most of the waveguide light Lwg rotating along the interface is reflected near the cusp CU and its path is suddenly changed, so that the incident angle becomes less than the total reflection critical angle and can pass through the interface. The light Lwg extracted in this way is reflected by the reflective portion 151 placed in the direction in which it proceeds, and can finally be emitted toward the top of the light emitting display device 10.

As such, by forming the bank 160 in the cardioid-shaped structure with the chaotic characteristics for the optical path, the path of the waveguide light Lwg in the emission layer 165 is chaotic and can be suddenly changed, so that the light extraction efficiency can be increased or maximized.

Moreover, as the light extraction efficiency of the light emitting display device 10 is increased or maximized, power consumption can be reduced compared to the related art light emitting display devices in realizing the same optical characteristics, and as a result, it can be driven with low power.

Meanwhile, the cardioid-shaped structure can also implement resonance characteristics for the waveguide light Lwg. For example, when the path of the waveguide light Lwg, which rotates while being totally reflected along the interface, is set to match a color wavelength band of each pixel region P, the waveguide light Lwg can resonate, i.e., can be constructively interfered, in the matched wavelength band. Accordingly, a micro cavity effect can be implemented even for light traveling in the horizontal direction on the substrate, and color reproduction rate can be improved.

Figure 5:
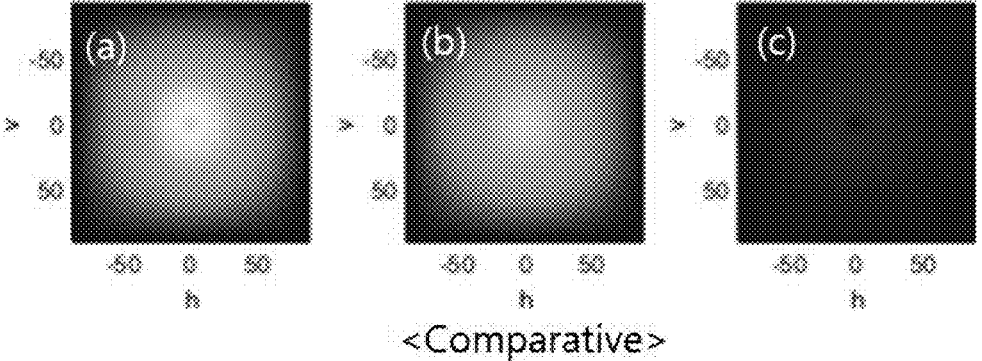
FIGS. 5 and 6 are views illustrating light extraction simulation results for a circular structure of a comparative example and a cardioid-shaped structure of a first embodiment of the present disclosure.
Figure 5:
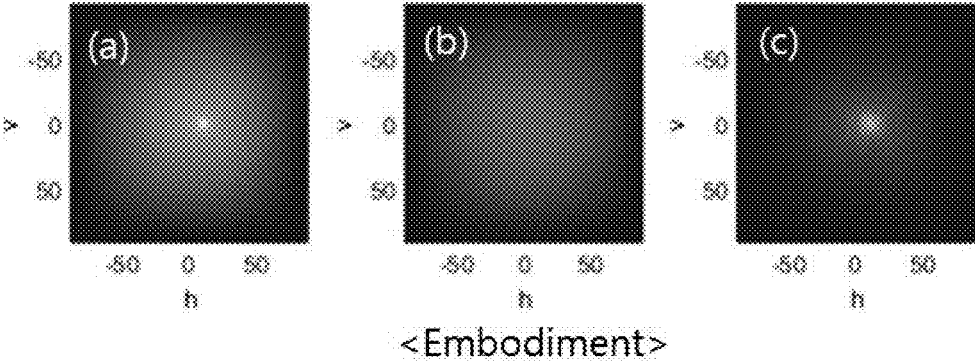
Figure 6:
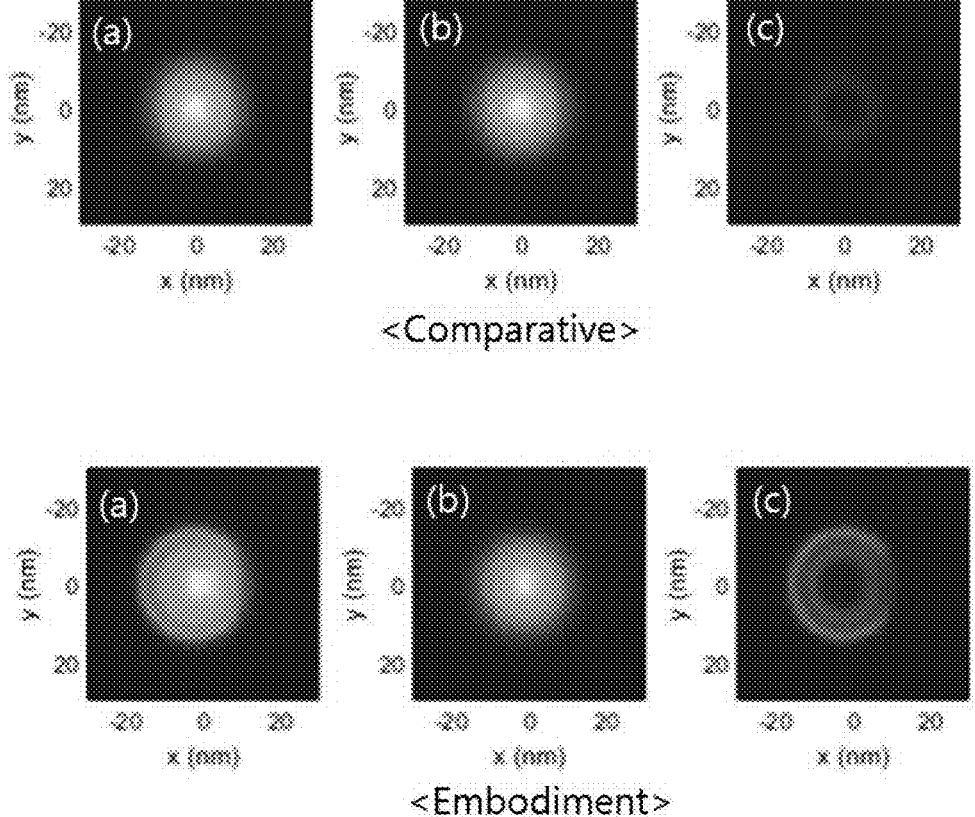

FIGS. 5 and 6 are views illustrating light extraction simulation results for a circular structure of a comparative example and a cardioid-shaped structure of a first embodiment of the present disclosure. FIG. 5 shows the light extraction simulation results in a far field for the circular structure of the comparative example and the cardioid-shaped structure of this embodiment, and FIG. 6 shows the light extraction simulation results in a near field for the circular structure of the comparative example and the cardioid-shaped structure of this embodiment.

In FIGS. 5 and 6, (a) shows an output profile of light including waveguide light, (b) shows an output profile of light excluding waveguide light, and (c) shows an output profile of waveguide light obtained by (a)-(b).

Looking at the far-field output characteristics of FIG. 5, it can be seen that in the comparative example, almost no waveguide light is output, as shown in (c). As such, in the case of the circular structure, most of the waveguide light is not extracted to the outside but is trapped inside and is extinguished.

On the other hand, it can be seen that in this embodiment, a significant amount of waveguide light is output to the outside, as shown in (c). As such, by the configuration of the cardioid-shaped structure, due to its chaotic characteristics, the waveguide light can be effectively extracted.

Looking at the near-field light output characteristics of FIG. 6, it can be seen that in the comparative example, waveguide light is output at a very small level, as shown in (c). As such, in the case of the circular structure, most of the waveguide light is not extracted to the outside but is trapped inside and is extinguished.

On the other hand, it can be seen that in this embodiment, a significant amount of waveguide light is output to the outside, as shown in (c). As such, by the configuration of the cardioid-shaped structure, due to its chaotic characteristics, the waveguide light can be effectively extracted.

Second Embodiment

Figure 7:
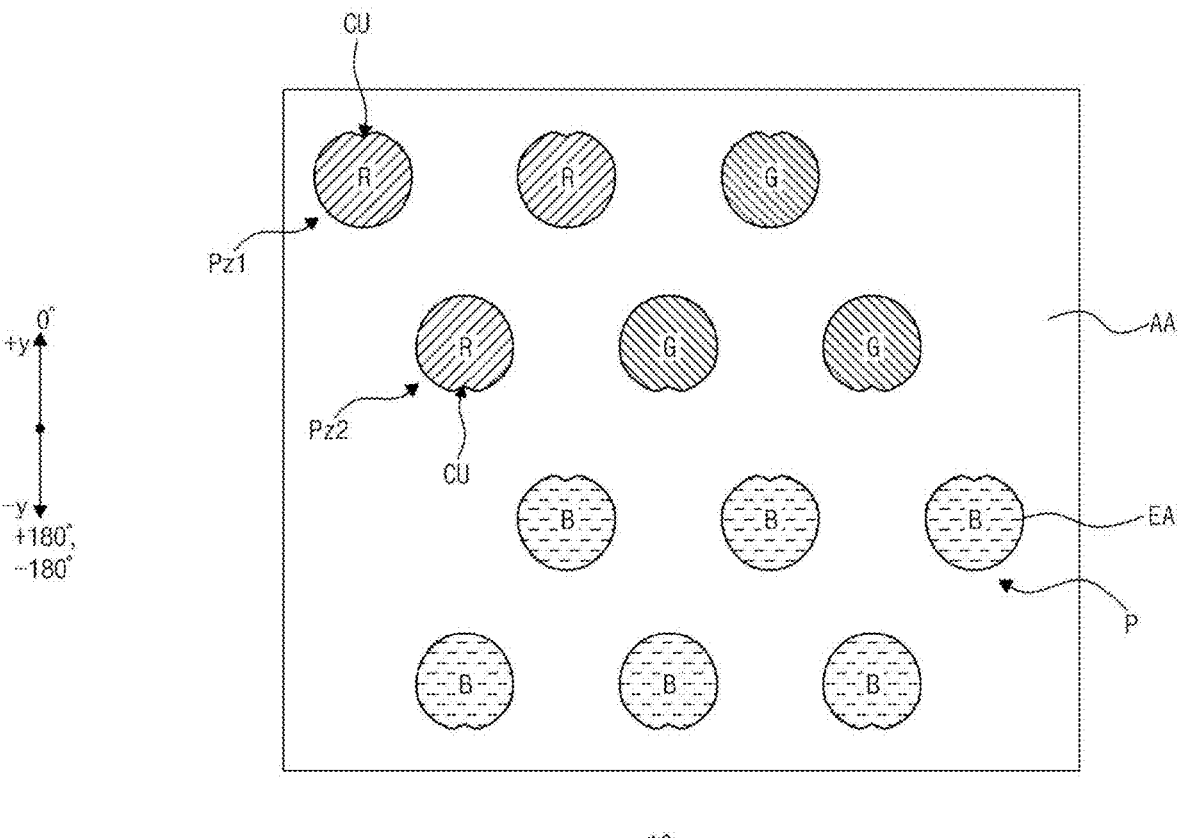
FIG. 7 is a plan view schematically illustrating an arrangement structure of pixel regions in a display region of a light emitting display device according to a second embodiment of the present disclosure.

FIG. 7 is a plan view schematically illustrating an arrangement structure of pixel regions in a display region of a light emitting display device according to a second embodiment of the present disclosure.

In the following description, detailed explanations of components identical or similar to those of the first embodiment described above may be omitted.

In FIG. 7, for convenience of description, the pixel regions P disposed in a portion of the display region AA of the light emitting display device 10 is shown. The emission region EA of the pixel region P is briefly shown in the cardioid-shaped structure.

Regarding the cardioid-shaped structure of the pixel region P of this embodiment, reference may be made to the above-described first embodiment.

Referring to FIG. 7, in the light emitting display device 10 of this embodiment, the plurality of pixel regions P may be arranged in the display region AA.

Meanwhile, the plurality of pixel regions P may include pixel regions P of different colors, for example, red (R), green (G), and blue (B) pixel regions P. In this embodiment, for convenience of explanation, a case where three red (R) pixel regions P and three green (G) pixel regions P are arranged in first and second rows, and six blue (B) pixel regions P are arranged in third and fourth rows is taken as an example. A number and location of red (R), green (G), and blue (B) pixel regions P may be different from those in FIG. 7.

In the light emitting display device 10 of this embodiment, in order to enhance a front emission (or front output) characteristics, pixel regions P with opposite orientations of the cardioid-shaped structure, for example, first azimuth (or first orientation) pixel regions Pz1 and second azimuth (or second orientation) pixel regions Pz2 may be used together.

For example, in the first azimuth pixel region Pz1, its cusp CU may be located at a first azimuth angle, for example, 0 degrees of the +y direction. And, in the second azimuth pixel region Pz2, its cusp CU may be located at a second azimuth angle, for example, 180 degrees (or −180 degrees) of the −y direction.

The first and second azimuth pixel regions Pz1 and Pz2 may be applied to each of the red (R), green (G), and blue (B) pixel regions P.

For example, regarding the red (R) pixel regions P, the first azimuth pixel region Pz1 of the red (R) may be arranged in the first row, and the second azimuth pixel region Pz2 of the red (R) may be arranged in the second row. Regarding the green (G) pixel regions P, the first azimuth pixel region Pz1 of the green (G) may be arranged in the first row, and the second azimuth pixel region Pz2 of the green (G) may be arranged in the second row. Regarding the blue (B) pixel regions P, the first azimuth pixel region Pz1 of the blue (B) may be arranged in the third row, and the second azimuth pixel region Pz2 of the blue (B) may be arranged in the fourth row.

In this way, for the pixel regions P of each color, the first and second azimuth pixel regions Pz1 and Pz2 may be alternately arranged along one direction (e.g., along the column direction).

Each of the first and second azimuth pixel regions Pz1 and Pz2 may be uniformly distributed within the display region AA, and a number of first azimuth pixel regions Pz1 and a number of second orientation pixel regions Pz2 may be substantially the same.

As such, by using a combination of the first and second azimuth pixel regions Pz1 and Pz2 in which the cardioid-shaped structures are arranged in opposite orientation directions, front emission characteristics can be enhanced.

Figure 8:
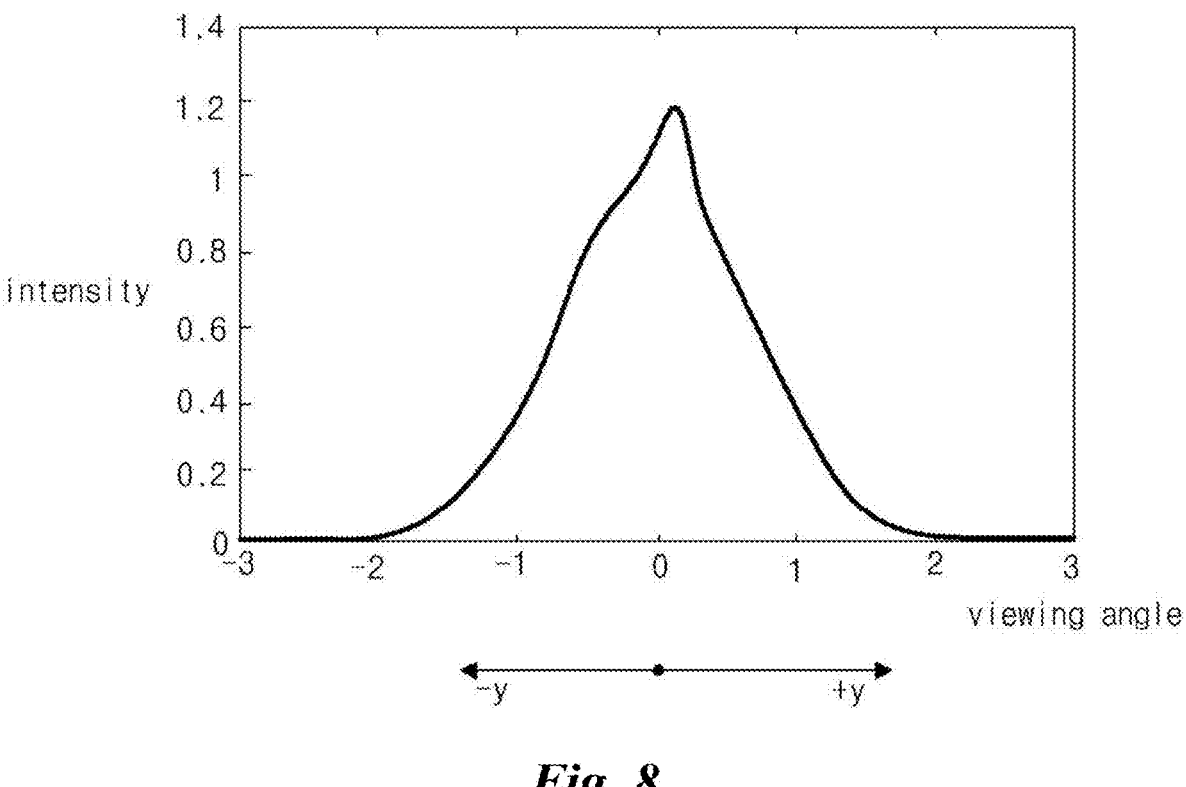
FIG. 8 is a view illustrating a distribution of light output of a pixel region with a cardioid-shaped structure according to a second embodiment of the present disclosure.

This is explained with reference to FIG. 8. FIG. 8 is a view illustrating a distribution of light output of a pixel region with a cardioid-shaped structure according to a second embodiment of the present disclosure. The distribution of light output in FIG. 8 is a distribution when a deformation parameter is 0.5, and a reflective portion has a straight line shape with an inclination angle of 45 degrees.

In FIG. 8, for convenience of explanation, a distribution of light output of the second azimuth pixel region Pz2 is shown. A distribution of light output of the first azimuth pixel region Pz1 has a left-right opposite form to FIG. 8.

Referring to FIG. 8, due to the asymmetry of the cardioid-shaped structure, for the light output from the second azimuth pixel region Pz2, a light output curve has an asymmetrical shape with a slight bias from a front perpendicular to a substrate surface (i.e., a viewing angle of 0 degrees in FIG. 8) toward a direction which the corresponding cusp CU faces (i.e., +y direction in FIG. 7). Accordingly, if only the second azimuth pixel regions Pz2 are disposed in the entire display region AA, emission is strengthened in an oblique viewing angle direction biased from the front to one side (i.e., upper side), and relatively, emission at the front viewing angle is somewhat reduced.

However, as in this embodiment, when the first and second azimuth pixel regions Pz1 and Pz2 with opposite orientations of the cardioid-shaped structure are arranged together, emission enhancement direction can be corrected to the front.

In other words, since the first azimuth pixel region Pz1 has the cardioid-shaped structure opposite in orientation to that of the second azimuth pixel region Pz2, the light output characteristics of the first azimuth pixel region Pz1 is also opposite to that of the second azimuth pixel region Pz2.

Accordingly, when the first azimuth pixel region Pz1 is arranged together with the second azimuth pixel region Pz2, as a result, the opposite asymmetric light output characteristics (or asymmetric viewing angle characteristics) are averaged so that the light output distribution can have a substantially symmetrical form based on the front direction. As a result, the emission characteristics can be strengthened in the front viewing angle direction.

Third Embodiment

Figure 9:
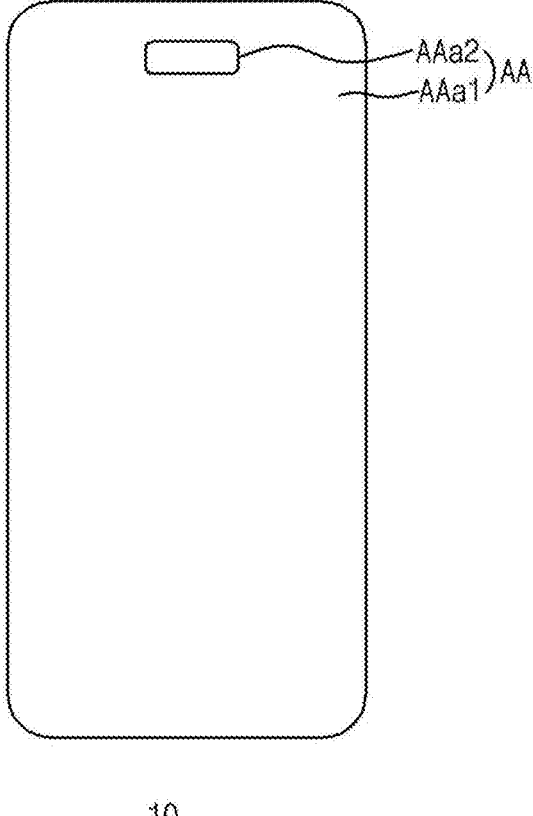
FIG. 9 is a plan view schematically illustrating a light emitting display device according to a third embodiment of the present disclosure.
Figure 10:
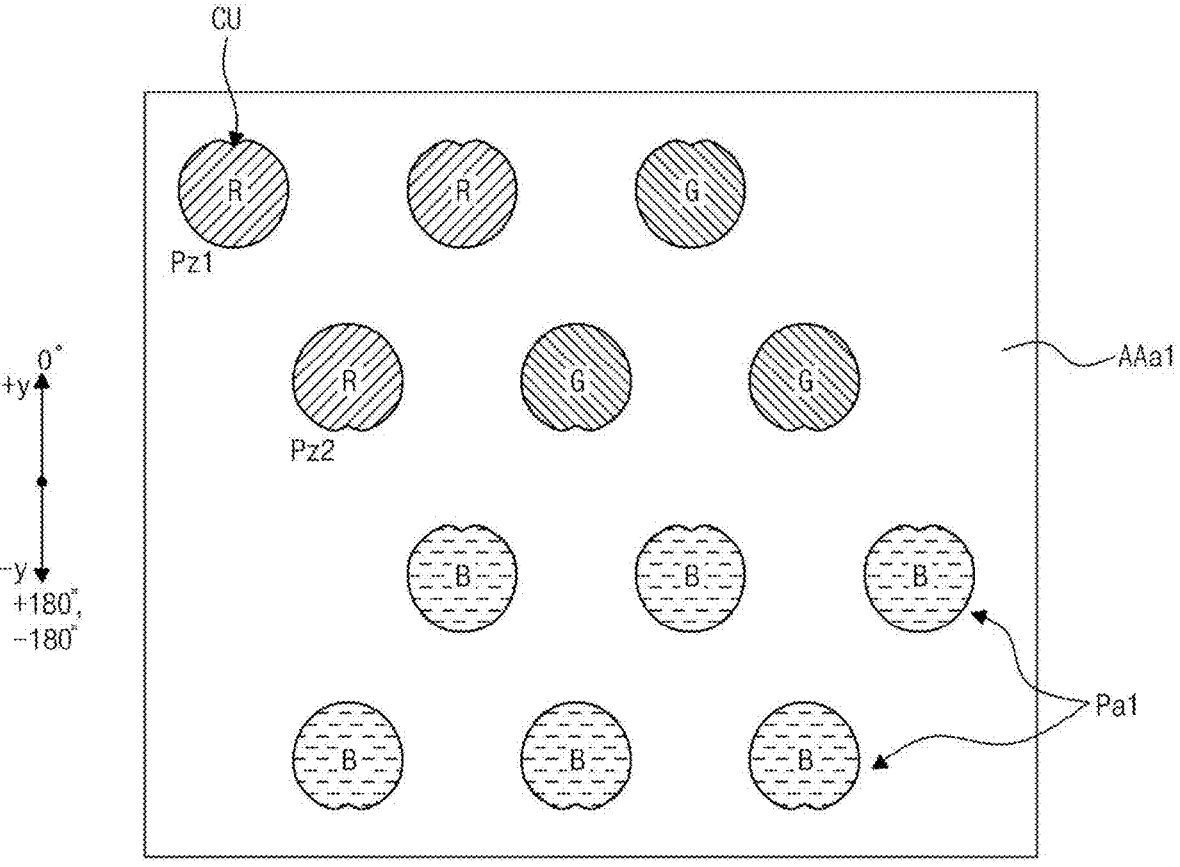
FIGS. 10 and 11 are views schematically illustrating arrangement structures of pixel regions in first and second regions of a display region, respectively, according to a third embodiment of the present disclosure.
Figure 11:
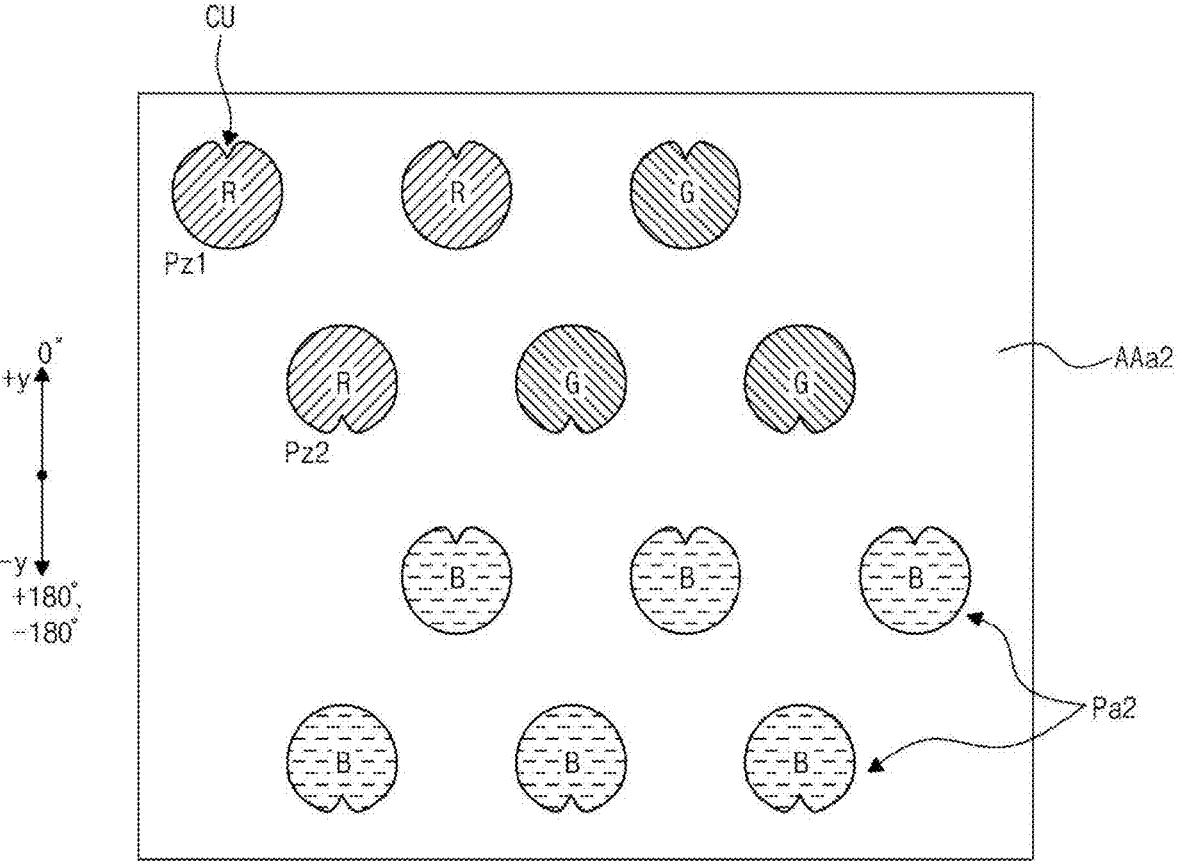
Figures 12, 13:
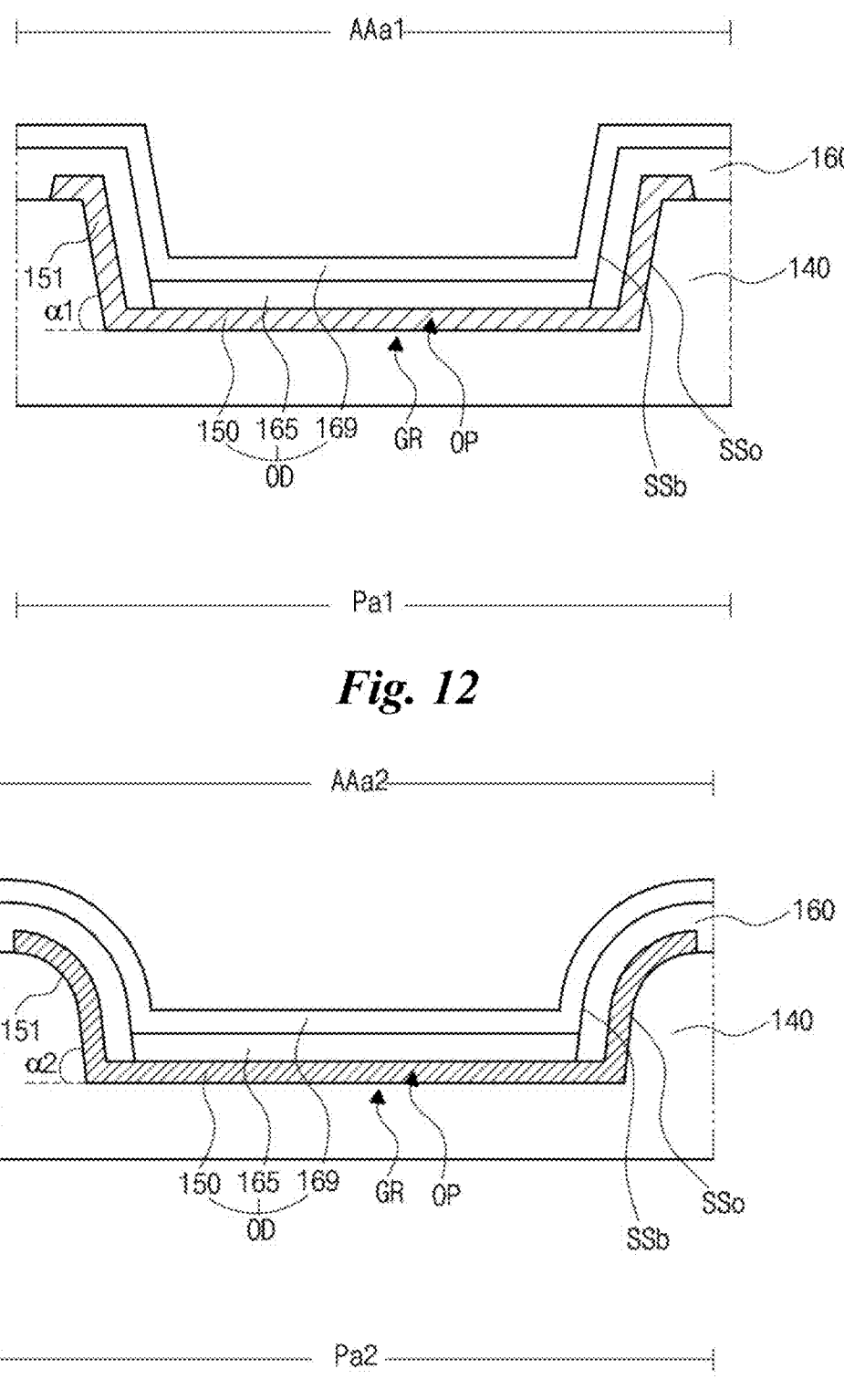
FIGS. 12 and 13 are views schematically illustrating cross-sectional structures of pixel regions in first and second regions of a display region, respectively, according to a third embodiment of the present disclosure.

FIG. 9 is a plan view schematically illustrating a light emitting display device according to a third embodiment of the present disclosure. FIGS. 10 and 11 are views schematically illustrating arrangement structures of pixel regions in first and second regions of a display region, respectively, according to a third embodiment of the present disclosure. FIGS. 12 and 13 are views schematically illustrating cross-sectional structures of pixel regions in first and second regions of a display region, respectively, according to a third embodiment of the present disclosure.

In the following description, detailed explanations of components identical or similar to those of the first and second embodiments described above may be omitted.

Referring to FIGS. 9 to 11, the light emitting display device 10 of this embodiment may be, for example, a display device used in a mobile device such as a smartphone, but not limited thereto.

In the light emitting display device 10, the display region AA may be defined to be divided into first and second regions AAa1.

Here, the first region AAa1 may substantially occupy most of the display region AA and may be a main display region. The first region AAa1 may have a relatively high PPI, that is, a density of corresponding pixel regions Pa1 may be relatively high.

The second region AAa2 may be an auxiliary display region defined in a portion of the display region AA, and an optical component such as cameras and/or sensor may be placed below it.

When normally operated, the second region AAa2 may form a single screen with the first region AAa1 to display an image. When the optical component is operated, such as in camera shooting, the second region AAa2 may not display an image and act as a transparent window.

Since the second region AAa2 performs a window function in addition to a display function, a PPI of the corresponding pixel regions Pa2 may be lower than that of the first region AAa1. That is, when the first region AAa1 has a first PPI, the second region AAa2 may have a second PPI smaller than that of the first region AAa1.

Meanwhile, in this embodiment, for convenience of explanation, a case where the second region AAa2 is located at an upper portion of the display region AA is taken as an example, but not limited thereto, and the second region AAa2 may be located at other portion of the display region AA.

As above, since the second region AAa2 has a low PPI, a viewing angle thereof is relatively small (or narrow) compared to the first region AAa1 of a high PPI.

In order to improve the viewing angle characteristics of the second region AAa2, in this embodiment, the pixel region Pa2 included in the second region AAa2 may be formed in a cardioid-shaped structure configured to realize a relatively wide viewing angle. In other words, the cardioid-shaped structure of the pixel region Pa2 included in the second region AAa2 may have an asymmetric shape configured to have a wider viewing angle than an asymmetric shape of the cardioid-shaped structure of the pixel region Pa1 included in the first region AAa1.

The differentiation in shape of the cardioid-shaped structure by region is explained in more detail below.

First, referring to FIG. 10, a first type pixel region Pa1, which is the pixel region Pa1 of the first region AAa1, may be arranged to enhance front emission characteristics as in the second embodiment described above. In other words, the first type pixel regions Pa1 of the first region AAa1 may include first and second azimuth pixel regions Pz1 and Pz2 whose orientations are opposite to each other.

Further, referring to FIG. 11, a second type pixel region Pa2, which is the pixel region Pa2 of the second region AAa2, may also be arranged to enhance front emission characteristics like the first type pixel region Pa1 of the first region AAa1. In other words, the second type pixel regions Pa2 of the second region AAa2 may include first and second azimuth pixel regions Pz1 and Pz2 whose orientations are opposite to each other.

In this way, by arranging the first and second azimuth pixel regions Pz1 and Pz2 in both the first region AAa1 and the second region AAa2, the overall front emission characteristics of the light emitting display device 10 can be enhanced.

Meanwhile, the cardioid-shaped structure of the first type pixel region Pa1 disposed in the first region AAa1 may have a relatively small first deformation parameter ε1 (e.g., 0.5) as a deformation parameter ε which is a factor that determines its shape (or planar shape).

In addition, the cardioid-shaped structure of the second type pixel region Pa2 disposed in the second region AAa2 may have a relatively large second deformation parameter ε2 (e.g., exceeding 0.5) as a deformation coefficient ε.

In this way, the second deformation parameter ε2 of the cardioid-shaped structure of the second type pixel region Pa2 of the second region AAa2 may be set larger than the first deformation coefficient ε1 of the cardioid-shaped structure of the first type pixel region Pa1 of the first region AAa1.

In this case, compared to the cardioid-shaped structure of the first type pixel region Pa1 of the first region AAa1, the cardioid-shaped structure of the second type pixel region Pa2 of the second region AAa2 may have a greater rate of change in curvature and have the cusp CU more pointed, and thus may have increased asymmetry.

Accordingly, compared to the cardioid-shaped structure of the first type pixel region Pa1 of the first region AAa1, the cardioid-shaped structure of the second type pixel region Pa2 of the second region AAa2 may allow light to be more concentrated and output in the front direction of the cusp CU.

Accordingly, in the second type pixel region Pa2 of the second region AAa2, light extraction in the oblique viewing angle direction can be enhanced.

Furthermore, referring to FIGS. 12 and 13, the second type pixel region Pa2 of the second region AAa2 may have a different inclination shape of the reflective portion from the first type pixel region Pa1 of the first region AAa1. In other words, the inclination shape of the reflective portion, which is a factor that determines the shape (or cross-sectional shape) of the cardioid-shaped structure, may be differentiated by region.

In this regard, referring to FIG. 12, as in the first and second embodiments described above, the first type pixel region Pa1 of the first display region AAa1 may have a linear inclination form in which the cardioid-shaped reflective portion 151 forms a constant inclination angle (or first inclination angle) α1 (e.g., 45 degrees) with the substrate surface as a whole.

Meanwhile, referring to FIG. 13, the second type pixel region Pa2 of the second region AAa2 may have a curved inclination form in which the cardioid-shaped reflective portion 151 is convex in an inward direction. For example, the reflective portion 151 may be configured in a curved form such that its inclination angle (or second inclination angle) α2 at the bottom is larger than the first inclination angle α1 (e.g., the second inclination angle α2 of 60 degrees), and its inclination angle continuously decreases toward a top (e.g., the inclination angle at the top of the reflective portion 151 is 0 degrees).

Accordingly, regarding the second type pixel region Pa2 of the second region AAa2, light reflected from the reflective portion 151 can be evenly distributed over a relatively wide viewing angle range, so that a range of light output in the oblique viewing angle direction from the front can be expanded evenly.

As above, by increasing the asymmetry of the cardioid-shaped structure of the second type pixel region Pa2 of the second region AAa2 and forming the reflective portion 151 of the second type pixel region Pa2 in a cross-sectional curved form, light extraction in the oblique viewing angle direction can be strengthened and a range of the light extraction can be expanded evenly.

Figure 14:
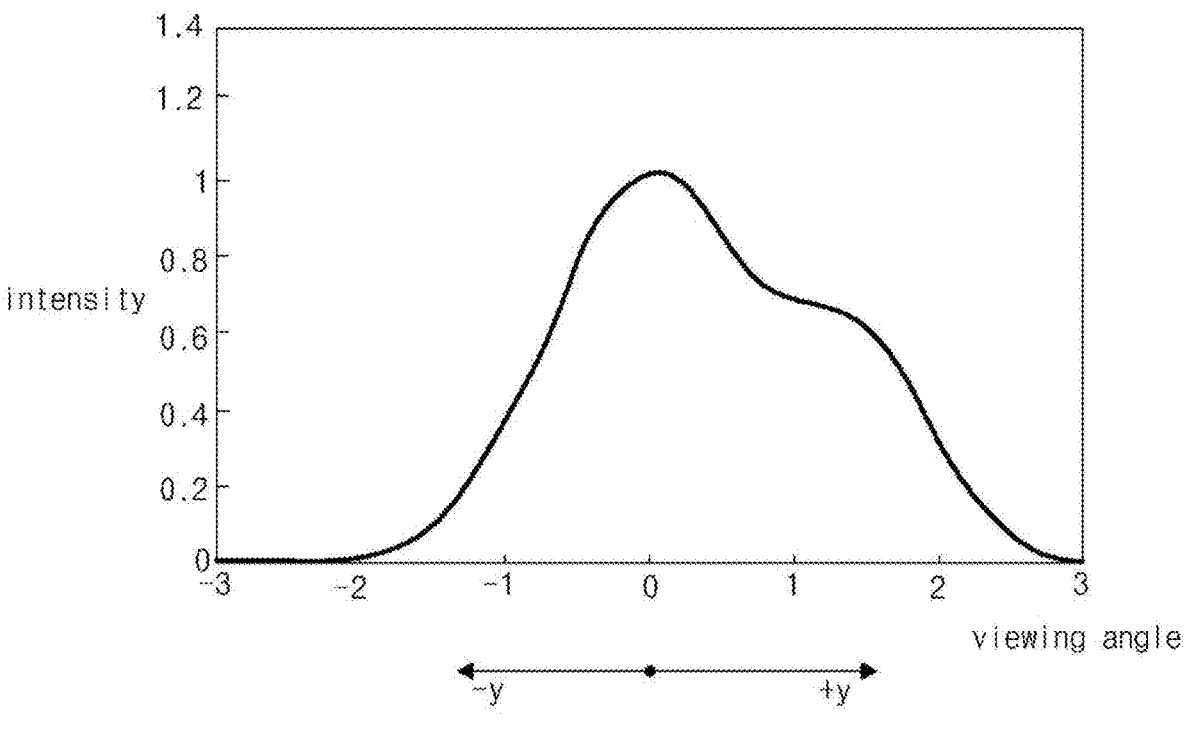
FIG. 14 is a view illustrating a distribution of light output of a second type pixel region according to a third embodiment of the present disclosure.

For the light output characteristics of the second type pixel region Pa2 of the second region AAa2, reference may be made to FIG. 14. FIG. 14 is a view illustrating a distribution of light output of a second type pixel region according to a third embodiment of the present disclosure.

Referring to FIG. 14, it can be seen that a light output curve has a gently expanded shape in a forward direction facing the cusp CU of the second type pixel region Pa2 of the second region AAa2, improving the viewing angle characteristics.

As above, in this embodiment, an amount of light output in the oblique viewing angle direction can be increased for the second region AAa2 with a low PPI, the viewing angle characteristics of this region can be improved.

Fourth Embodiment

Figure 15:
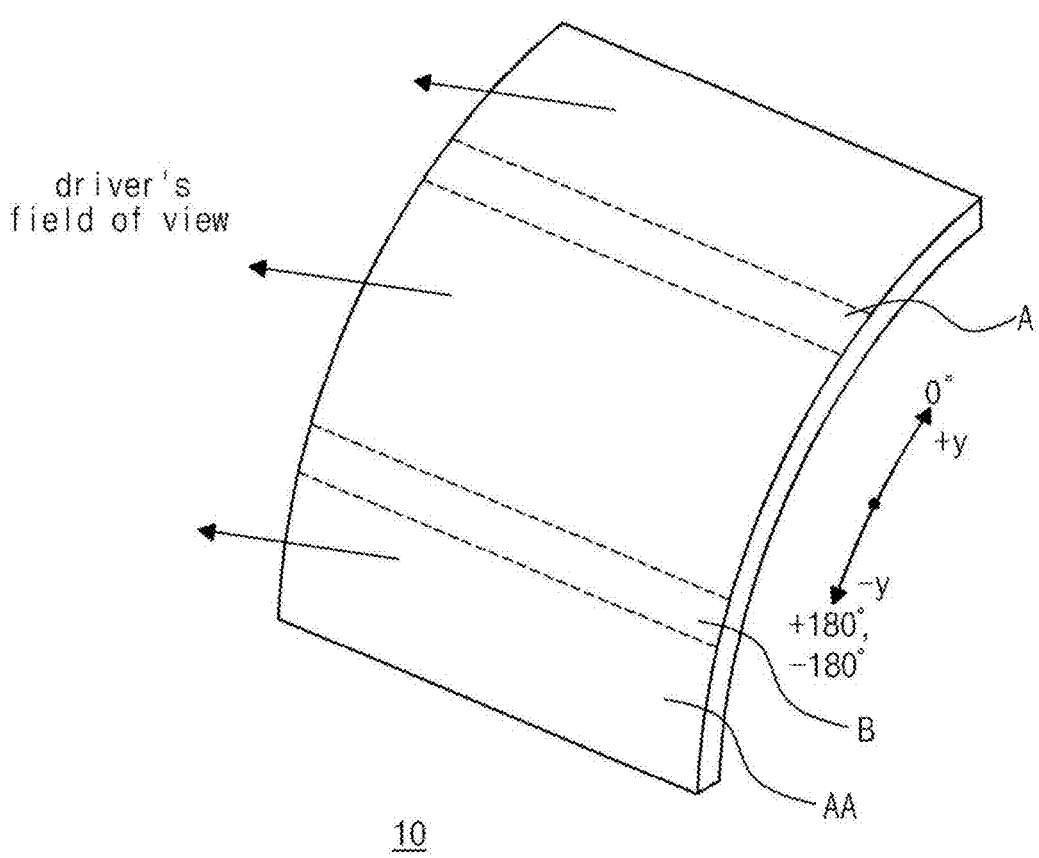
FIG. 15 is a perspective view schematically illustrating a light emitting display device according to a fourth embodiment of the present disclosure.
Figure 16:
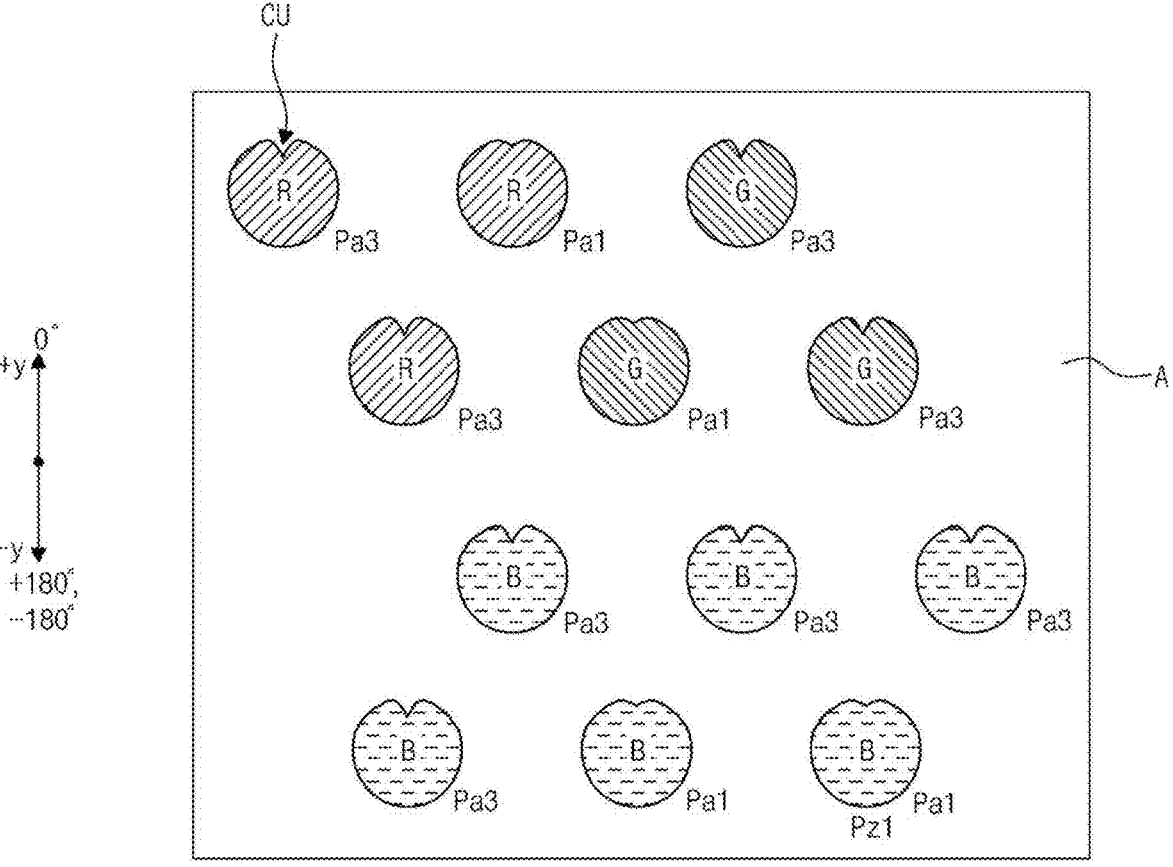
Figure 17:
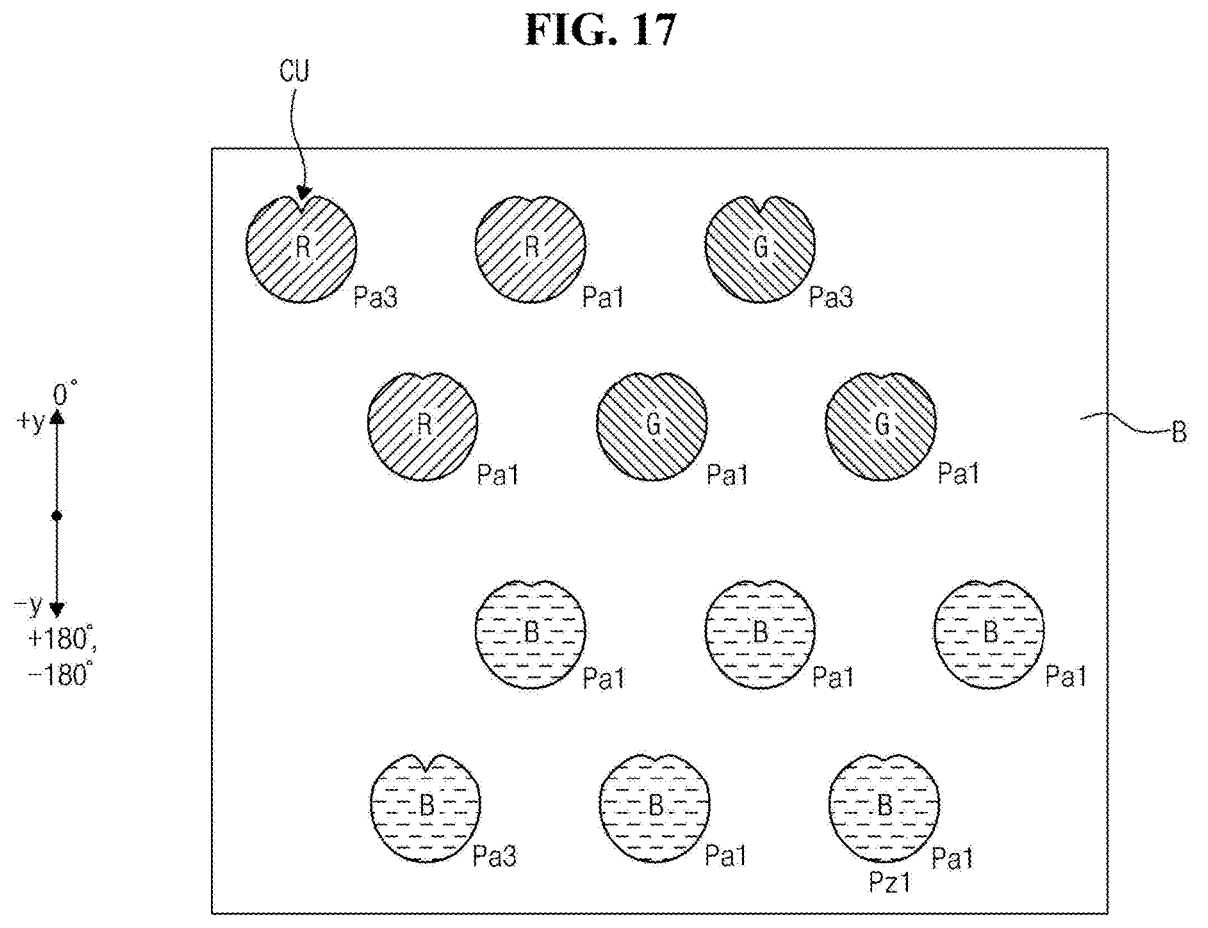
Figures 18, 19:
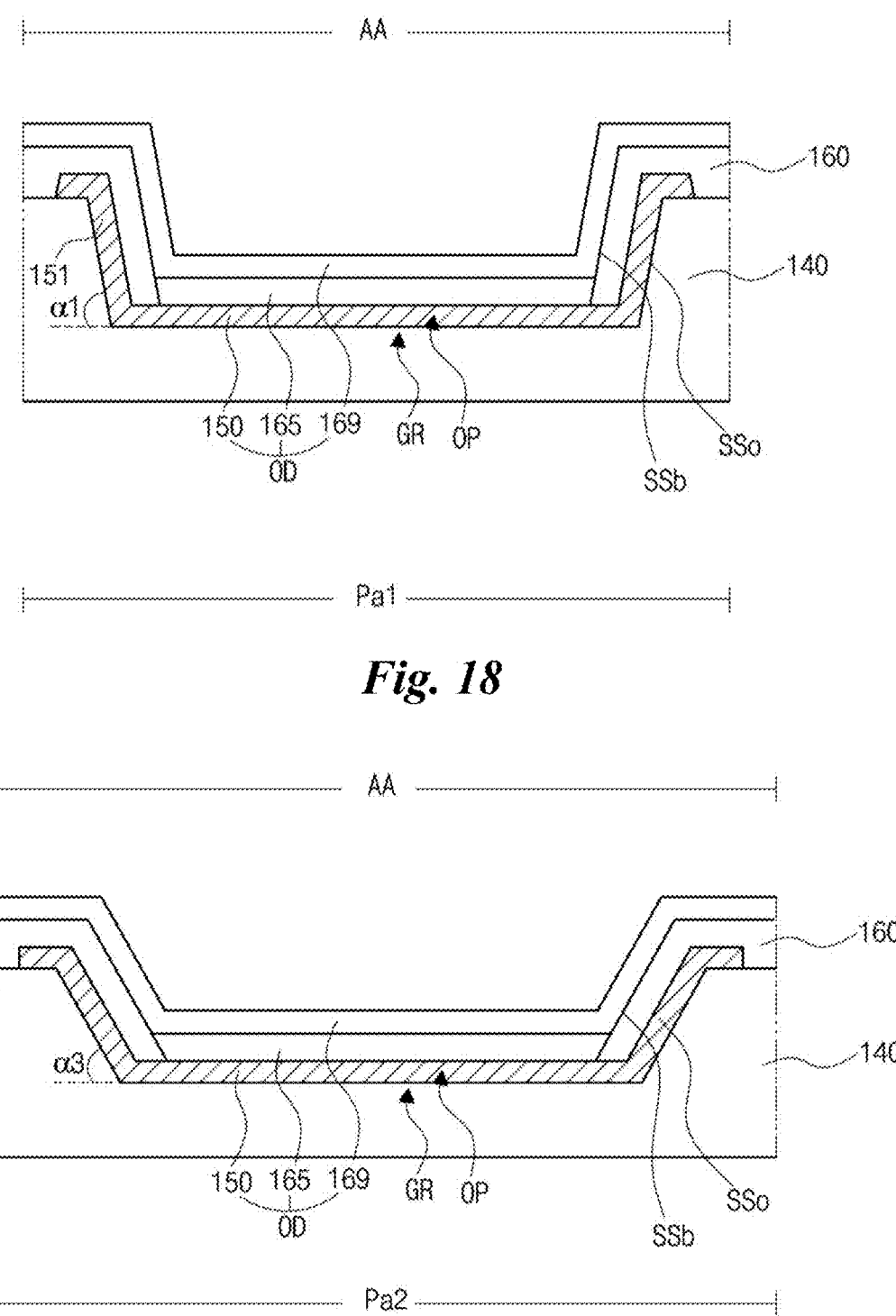
FIGS. 18 and 19 are views schematically illustrating cross-sectional structures of first and third type pixel regions, respectively, according to a fourth embodiment of the present disclosure.

FIG. 15 is a perspective view schematically illustrating a light emitting display device according to a fourth embodiment of the present disclosure. FIGS. 16 and 17 are views schematically illustrating arrangement structures of pixel regions in regions A and B within a display region of FIG. 15, respectively. FIGS. 18 and 19 are views schematically illustrating cross-sectional structures of first and third type pixel regions, respectively, according to a fourth embodiment of the present disclosure.

In the following description, detailed explanations of components identical or similar to those of the first to third embodiments described above may be omitted.

Referring to FIGS. 15 to 17, the light emitting display device 10 of this embodiment is a curved display device and may be applied to, for example, a center fascia of an automobile, but not limited thereto.

Meanwhile, in this embodiment, the curved light emitting display device 10 applied to the center fascia of an automobile is taken as an example.

For convenience of explanation, the light emitting display device 10 that is curved overall from an upper end to a lower end of a screen is taken as an example.

For the light emitting display device 10, it would be beneficial for a viewing angle to be set in a downward orientation direction that matches a driver's field of view rather than in front of the light emitting display device 10.

For example, if light emitted from the curved light emitting display device 10 of the center fascia is reflected on a windshield of an automobile, it acts as a distraction to the driver. Accordingly, in the curved light emitting display device 10, it is beneficial that the viewing angle is set in the downward orientation direction in an asymmetric form so as to match the driver's field of view.

Considering this, in this embodiment, all of the cardioid-shaped pixel regions Pa1 and Pa3 disposed in the display region AA of the curved light emitting display device 10 may be arranged to implement asymmetric viewing angle characteristics in the downward direction from the front of the display device.

For example, as shown in FIGS. 16 and 17, a first type pixel region Pa1 and a third type pixel region Pa3 having different asymmetric viewing angle characteristics may be arranged together in the display region AA.

The first and third type pixel regions Pa1 and Pa3 may all have the same orientation of cardioid-shaped structure to emphasize the downward asymmetric viewing angle characteristics.

For example, all of the first type pixel regions Pa1 in the display region AA may be configured so that their cusps CU are located in the +y direction of the first azimuth angle (i.e., at 0 degrees) which is the upward direction. Likewise, all of the third type pixel regions Pa3 in the display region AA may be configured so that their cusps CU are located in the +y direction of the first azimuth angle (i.e., 0 degrees) which is the upward direction.

In this way, since the orientations of the cardioid-shaped structures of the pixel regions Pa1 and Pa3 in the display region AA can all be set in the same upward direction, the viewing angle in the downward direction can be enhanced.

FIGS. 16 and 18 may be referred to for the shape of the cardioid-shaped structure of the first type pixel region Pa1, and the first type pixel region Pa1 may have the cardioid-shaped structure that is substantially the same shape as the first type pixel region Pa1 of the third embodiment described above. In this regard, the first type pixel region Pa1 may have a relatively small first deformation parameter $\varepsilon 1$ (e.g., 0.5), and may have a linear inclination form in which its reflective portion 151 forms a first inclination angle $\alpha 1$ (e.g., 45 degrees).

Meanwhile, referring to FIGS. 17 and 19 for the cardioid-shaped structure of the third type pixel region Pa3, the third type pixel region Pa3 may have a relatively large third deformation parameter $\varepsilon 3$ (e.g., exceeding 0.5), and may have a linear inclination form in which its reflective portion 151 forms a third inclination angle $\alpha 3$ (e.g., less than 45 degrees) lower than the first inclination angle $\alpha 1$.

In this way, compared to the first type pixel region Pa1, the inclination angle $\alpha 3$ of the reflective portion 151 in the third type pixel region Pa3 is formed to be small. Thus, the extraction range of the light reflected from the reflective portion 151 of the third type pixel region Pa3 can be expanded in the direction in which the corresponding cusp CU is facing, that is, in the downward direction, and the viewing angle characteristics in the downward direction can be strengthened.

Figure 20:
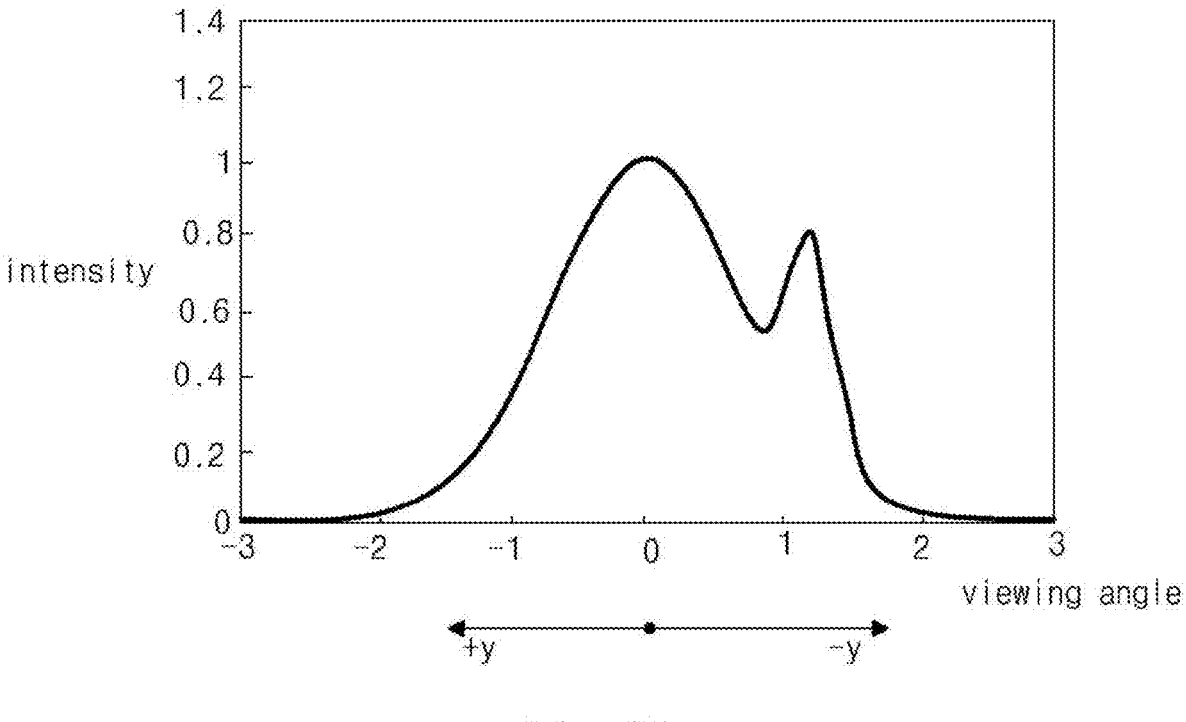
FIG. 20 is a view illustrating a distribution of light output of a third type pixel region according to a fourth embodiment of the present disclosure.

FIG. 20 may be referred to for the light output characteristics of this third type pixel region Pa3. FIG. 20 is a view illustrating a distribution of light output of a third type pixel region according to a fourth embodiment of the present disclosure.

Referring to FIG. 20, it can be seen that a light output curve has an expanded shape in a forward direction facing the cusp CU of the third type pixel region Pa3, thereby improving the viewing angle characteristics. Meanwhile, compared to the second type pixel region of the third embodiment described above, the light intensity of the third type pixel region Pa3 of this embodiment has a higher light intensity at an oblique viewing angle, so it can be seen that the viewing angle asymmetry and viewing angle intensity are higher.

As above, in this embodiment, the first type pixel region Pa1 which has characteristics of viewing angle close to the front, and the third type pixel region Pa3 which has characteristics of a larger viewing angle than the first type pixel region Pa2 can be used in combination.

Here, a combination ratio of the first and third type pixel regions Pa1 and Pa3 can be differentiated depending on a region within the display region AA.

In this regard, the first and third type pixel regions Pa1 and Pa3 may be arranged in such a way that the closer to the upper end of the display region AA, the higher the ratio of the third type pixel region Pa3 with high asymmetric viewing angle characteristics, and the closer to the lower end of the display region AA, the higher the ratio of the first type pixel region Pa3 with low asymmetric viewing angle characteristics.

For example, the third type pixel region Pa3 may be placed at 100% in the upper end region of the display region AA, the first type pixel region Pa1 may be placed at 100% in the lower end region of the display region AA, and from the upper end region to the lower end region, the ratio of the third type pixel region Pa3 may be gradually reduced and the ratio of the first type pixel region Pa1 may be increased.

Regarding the above combination ratios, referring to FIGS. 16 and 17, FIG. 16 shows the ratio of the first and third type pixel regions Pa1 and Pa3 in a region A near the upper end, and FIG. 17 shows the ratio of the first and third pixel regions Pa1 and Pa3 in a region B near the lower end.

In the region A, the third type pixel region (Pa3) may be arranged at a higher ratio than the first type pixel region Pa1, for example, the third and first type pixel regions Pa3 and Pa1 may be arranged in a ratio of 2:1 (i.e., Pa3:Pa1=2:1). Accordingly, in the region A at a relatively higher position, the viewing angle characteristics of the third type pixel region Pa3 are highly reflected, so that the viewing angle of the region A can match the driver's field of view.

In the region B, the first type pixel region Pa1 may be arranged at a higher ratio than the third type pixel region Pa3, for example, the first and third type pixel regions Pa1 and Pa3 may be arranged in a ratio of 2:1 (i.e., Pa1:Pa3=2:1). Accordingly, in the region B at a relatively lower position, the viewing angle characteristics of the first type pixel region Pa1 are highly reflected, and the viewing angle of the region B can match the driver's field of view.

As such, the viewing angle characteristics can be differentiated by differentiating the combination ratio of the first and third type pixel regions Pa1 and Pa3 according to the positions of the curved surface of the light emitting display device 10. As a result, it is possible to secure the viewing angle characteristics of the light emitting display device 10 that matches the driver's field of view.

Fifth Embodiment

Figure 21:
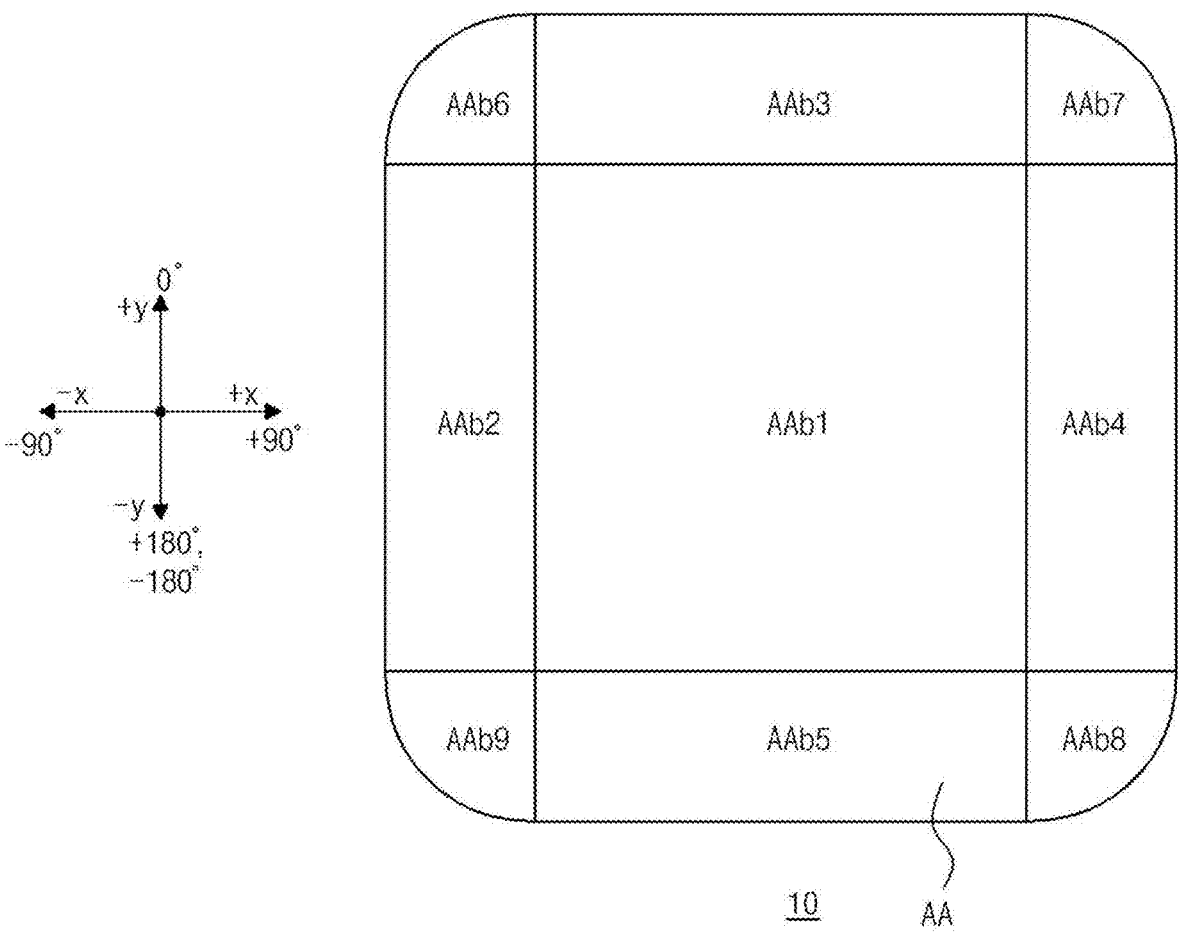
FIG. 21 is a plan view schematically illustrating a light emitting display device according to a fifth embodiment of the present disclosure.
Figure 22:
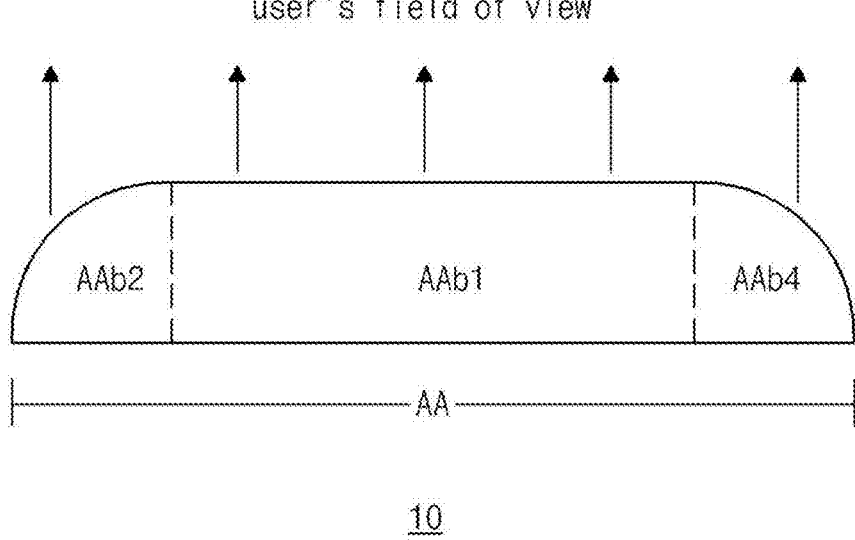
FIG. 22 is a cross-sectional view schematically illustrating a viewing angle for each region of a light emitting display device according to a fourth embodiment of the present disclosure.
Figure 23:
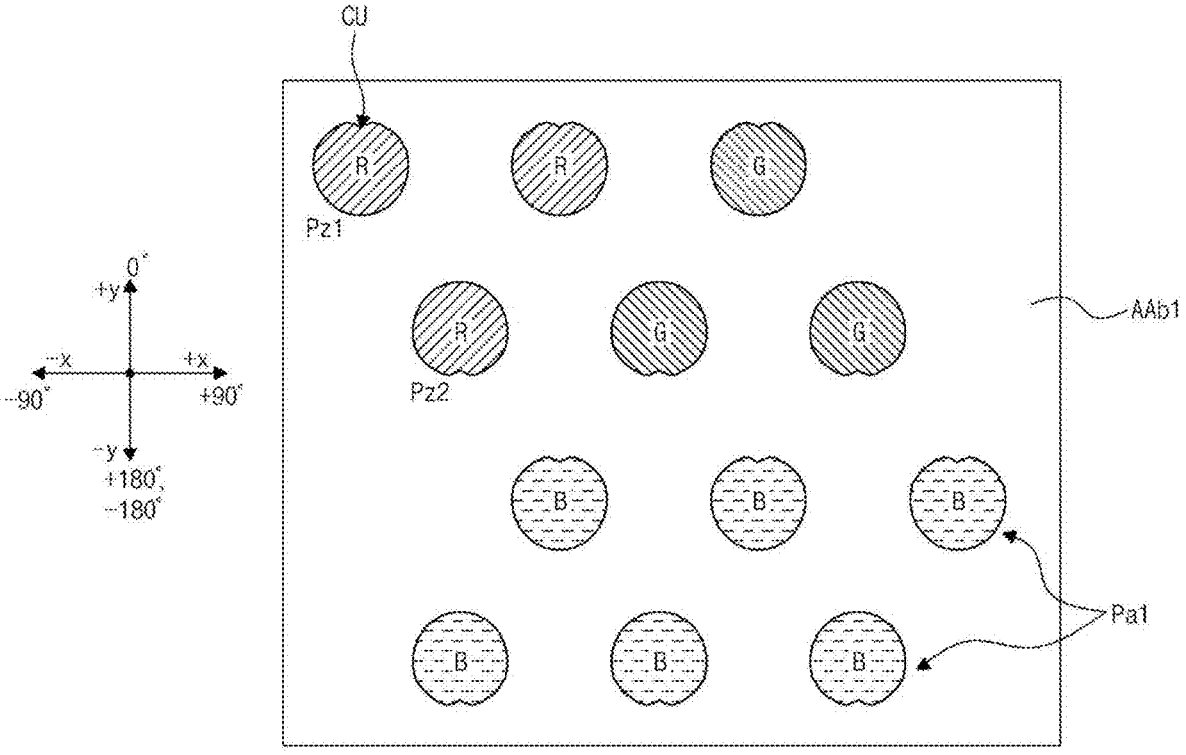
FIGS. 23, 24, and 25 are views schematically illustrating arrangement structures of pixel regions in a flat region, a side curved region, and a corner curved region of FIG. 21, respectively.
Figure 24:
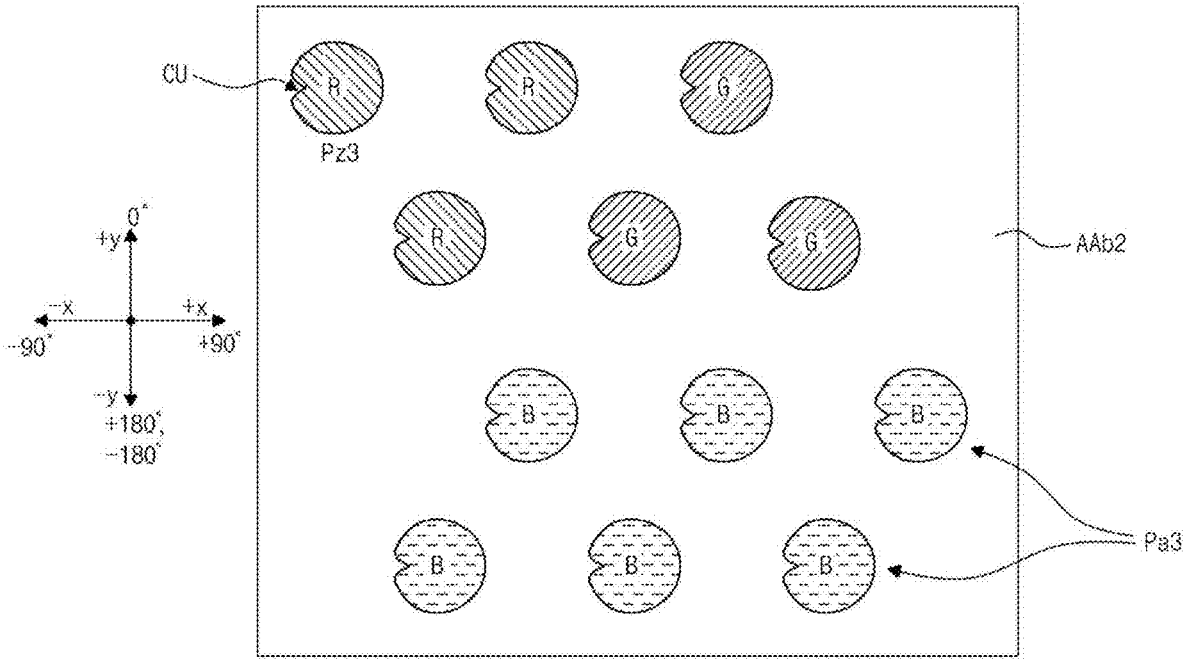
Figure 25:
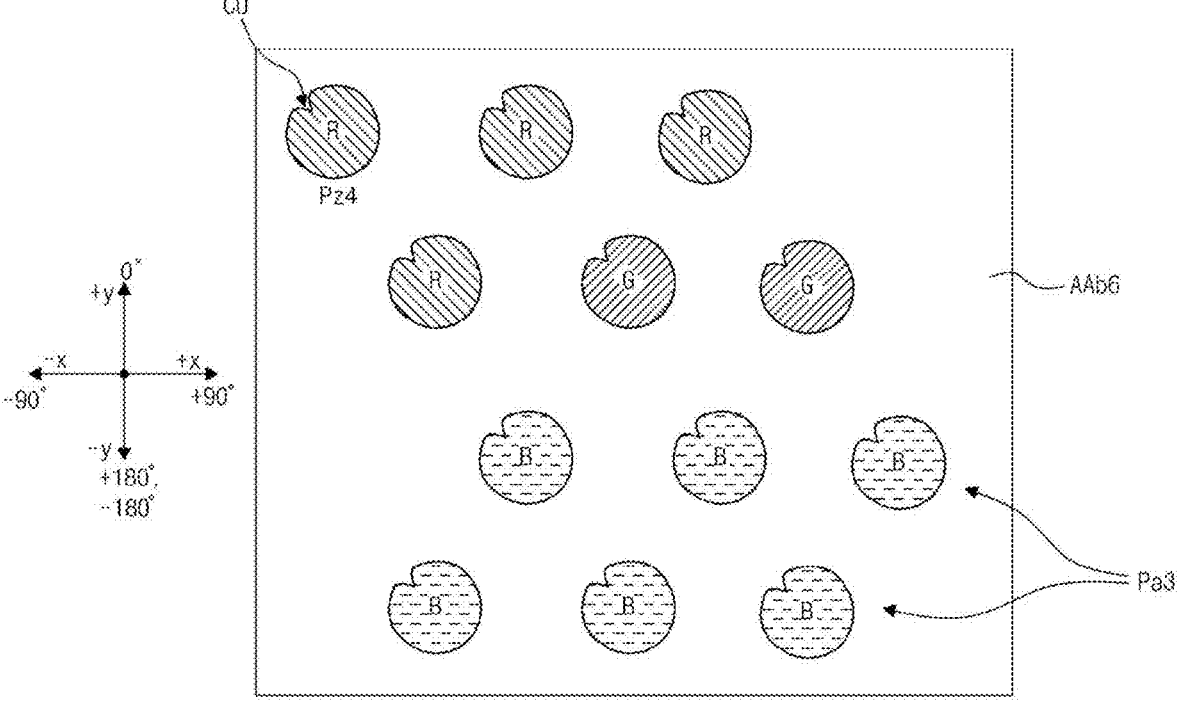

FIG. 21 is a plan view schematically illustrating a light emitting display device according to a fifth embodiment of the present disclosure. FIG. 22 is a cross-sectional view schematically illustrating a viewing angle for each region of a light emitting display device according to a fourth embodiment of the present disclosure. FIGS. 23, 24, and 25 are views schematically illustrating arrangement structures of pixel regions in a flat region, a side curved region, and a corner curved region of FIG. 21, respectively.

In the following description, detailed explanations of components identical or similar to those of the first to fourth embodiments described above may be omitted.

Referring to FIGS. 21 to 25, the light emitting display device 10 of this embodiment may be applied to, for example, a smart watch where edges of the display region AA are curved, but not limited thereto.

Meanwhile, in this embodiment, the edge-curved light emitting display device 10 applied to the smart watch is taken as an example.

As shown in FIG. 22, it would be beneficial that the edge-curved light emitting display device 10 has a viewing angle set in a front direction that matches a user's field of view.

Considering this, in this embodiment, the cardioid-shaped pixel regions Pa1 and Pa3 arranged in the display region AA of the light emitting display device 10 may be arranged to implement front viewing angle characteristics of the light emitting display device 10.

In this regard, for example, the display region AA of the light emitting display device 10 may include a flat region Aab1 of a flat shape located in the center, and an edge region of a curved shape which surrounds the flat region Aab1 and is convex in an outward direction. The curved edge region may include, for example, first, second, third, and fourth side curved regions Aab2, Aab3, Aab4, Aab5 which are located on four sides (e.g., left side, upper side, right side, and lower side) of the flat region Aab1, and first, second, third, and fourth corner curved regions Aab6, Aab7, Aab8, Aab9 which are located at four corners (e.g., upper left corner, upper right corner, lower right corner, and lower left corner) of the flat region Aab1.

In this case, referring to FIG. 23, the first type pixel region Pa1 may be disposed in the flat region Aab1, which is a main region of the display region AA, as in the first to fourth embodiments described above.

Here, in order to secure the front viewing angle characteristics of the flat region Aab1, the first type pixel region Pa1 may include the first and second azimuth pixel regions Pz1 and Pz2 with opposite orientations, as in the first and second embodiments described above. For example, in the first azimuth pixel region Pz1, its cusp CU may be located at an azimuth angle of 0 degrees in the +y direction, and in the second azimuth pixel region Pz2, its cusp CU may be located at an azimuth angle of +180 degrees (or −180 degrees) in the −y direction.

Referring to FIG. 24, in the first side curved region Aab2 located on the left side of the flat region Aab1, the third type pixel region Pa3 with asymmetric viewing angle characteristics may be arranged, as in the third and fourth embodiments described above.

Here, since the first side curved region Aab2 is located on the left side of the flat region Aab1, the orientation of the cardioid-shaped structure of the third type pixel region Pa3 may be set to implement the viewing angle characteristics in the right direction opposite to the left position of the first side curved region Aab2. For example, in the cardioid-shaped structure of the third type pixel region Pa3, the cusp CU may be located at an azimuth angle of −90 degrees in the −x direction as the left direction. In this way, the third type pixel region Pa3 may formed of a third azimuth pixel region Pz3. Accordingly, the viewing angle direction of the first side curved region Aab2 may be set to the front direction of the light emitting display device 10.

The third type pixel region Pa3 may also be placed in the second, third, and fourth side curved regions Aab3, Aab4, and Aab5 which are other side curved regions, and the orientation of the third type pixel region Pa3 in each of the second, third, and fourth side curved regions Aab3, Aab4, and Aab5 may be set according to the positional relationship with the flat region Aab1.

For example, since the second side curved region Aab3 is located on the upper side of the flat region Aab1, in order to implement the viewing angle characteristics in the downward direction, the cardioid-shaped structure of the third type pixel region Pa3 may have the cusp CU located at an azimuth angle of 0 degrees in the +y direction.

In addition, since the third side curved region Aab4 is located on the right side of the flat region Aab1, in order to implement the viewing angle characteristics in the left direction, the cardioid-shaped structure of the third type pixel region Pa3 may have the cusp CU located at an azimuth angle of +90 degree in the +x direction.

In addition, since the fourth side curved region Aab5 is located on the lower side of the flat region Aab1, in order to implement the viewing angle characteristics in the upward direction, the cardioid-shaped structure of the third type pixel region Pa3 may have the cusp CU located at an azimuth angle of +180 degrees (or −180 degrees) in the −y direction.

Meanwhile, referring to FIG. 25, the third type pixel region Pa3 with asymmetric viewing angle characteristics may be arranged in the first corner curved region Aab6 located on the upper left side of the flat region Aab1.

Here, since the first corner curved region Aab6 is located on the upper left side of the flat region Aab1, the orientation of the cardioid-shaped structure of the third type pixel region Pa3 may be set to implement the viewing angle characteristics in the lower right direction opposite to the position of the first corner curved region Aab6. For example, in the cardioid-shaped structure of the third type pixel region Pa3, the cusp CU may be located at an azimuth angle of −45 degrees in the upper left diagonal direction (or upper left direction). In this way, the third type pixel region Pa3 may be formed of a fourth azimuth pixel region Pz4. Accordingly, the viewing angle direction of the first corner curved region Aab6 may be set to the front direction of the light emitting display device 10.

The third type pixel region Pa3 may also be placed in the second, third, and fourth corner curved regions Aab7, Aab8, and Aab9 which are other corner curved regions, and the orientation of the third type pixel region Pa3 in each of the second, third, and fourth corner curved regions Aab7, Aab8, and Aab9 may be set according to the positional relationship with the flat region Aab1.

For example, since the second corner curved region Aab7 is located on the upper right side of the flat region Aab1, in order to implement the viewing angle characteristics in the lower left direction, the cardioid-shaped structure of the third type pixel region Pa3 may have the cusp CU located at an azimuth angle of +45 degrees in the upper right diagonal direction.

In addition, since the third corner curved region Aab8 is located on the lower right of the flat region Aab1, in order to implement the viewing angle characteristics in the upper left direction, the cardioid-shaped structure of the third type pixel region Pa3 may have the cusp CU located at an azimuth angle of +135 degrees in the lower right diagonal direction.

In addition, since the fourth corner curved region Aab9 is located on the lower left of the flat region Aab1, in order to implement the viewing angle characteristics in the upper right direction, the cardioid-shaped structure of the third type pixel region Pa3 may have the cusp CU located at an azimuth angle of −135 degrees in the lower left diagonal direction.

As described above, by differentiating the orientation of the pixel region with asymmetric viewing angle characteristics according to the positions of the edge curved region of the light emitting display device 10, it is possible to secure the viewing angle characteristics of the light emitting display device 10 that matches the user's field of view.

As described above, according to the embodiments of the present disclosure, by configuring the pixel region in the cardioid-shaped structure with the chaotic characteristics for the optical path, the path of the horizontal waveguide light can be chaotic and rapidly changed, thereby increasing or maximizing the light extraction efficiency of the light emitting display device.

In addition, by arranging the pixel regions with the cardioid-shaped structures opposite in orientation in the display region together, the emission characteristics can be enhanced in the front viewing angle direction of the light emitting display device.

In addition, for the light emitting display device including the low PPI display region with the low viewing angle characteristics, the pixel region having the cardioid-shaped structure with the high asymmetry and including the reflective portion with the wide viewing angle range are arranged in the low PPI display region, so that the viewing angle characteristics of the PPI display region can be improved.

In addition, for the curved light emitting display device, by differentiating the combination ratio of the pixel regions with the cardioid-shaped structures that have different asymmetric viewing angle characteristics according to the positions of the curved surface, it is possible to secure the viewing angle characteristics that match the user's field of view.

In addition, for the light emitting display device in which the edge of the display region is curved, by differentiating the orientation of the cardioid-shaped pixel region according to the positions of the curved region, it is possible to secure the viewing angle characteristics that match the user's field of view.

Moreover, as described above, as the light efficiency of the light emitting display device according to the embodiments of the present disclosure is improved, power consumption can be reduced, and the light emitting display device can be driven with low power.

It will be apparent to those skilled in the art that various modifications and variation can be made in the present disclosure without departing from the spirit or scope of the disclosure. Thus, it is intended that the present disclosure cover the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light emitting display device, comprising:

a bank that is on a substrate and includes an opening corresponding to each of a plurality of pixel regions of a display region;

an inclined reflective portion that is below the bank and disposed in each of the plurality of pixel regions; and a light emitting diode disposed in the opening, wherein each of the plurality of pixel regions is configured such that the corresponding opening and reflective portion have a cardioid-shaped structure that includes a cusp, wherein the display region includes a first region of a first pixels per inch (PPI) and a second region of a second PPI smaller than the first PPI, wherein the pixel region disposed in the first region has a first type cardioid-shaped structure, and the pixel region disposed in the second region has a second type cardioid-shaped structure, and wherein the first type cardioid-shaped structure has a smaller rate of change in curvature than the second type cardioid-shaped structure.

2. The light emitting display device of claim 1, wherein the reflective portion of the pixel region disposed in the first region has a linear inclination form, and wherein the reflective portion of the pixel region disposed in the second region has a curved inclination form of being convex toward an inside of the pixel region.

3. The light emitting display device of claim 2, wherein the reflective portion of the first region has a first inclination angle, and wherein the reflective portion of the second region has a second inclination angle at its bottom that is larger than the first inclination angle, and decreases in inclination angle toward its top.

4. The light emitting display device of claim 1, wherein the pixel regions of the first region include a pixel region whose cardioid-shaped structure is located in a first orientation, and a pixel region whose cardioid-shaped structure is located in a second orientation opposite to the first orientation.

5. The light emitting display device of claim 1, wherein the pixel regions of the second region include a pixel region whose cardioid-shaped structure is located in a first orientation, and a pixel region whose cardioid-shaped structure is located in a second orientation opposite to the first orientation.

6. The light emitting display device of claim 4, wherein in the first region, the pixel regions of the first and second orientations are arranged alternately along one direction.

7. The light emitting display device of claim 5, wherein in the second region, the pixel regions of the first and second orientations are arranged alternately along one direction.

8. The light emitting display device of claim 1, wherein the cardioid-shaped structure is defined as $r=r0*(1+\epsilon*\cos(\theta/2))$, where $\theta$ is an azimuth angle, $r0$ is a radius at the cusp, $r$ is a radius at $\theta$, and $\epsilon$ is a deformation parameter.

9. The light emitting display device of claim 1, wherein the light emitting diode includes a first electrode, an emission layer on the first electrode, and a second electrode on the emission layer, and wherein the reflective portion extends from the first electrode.

* * * * *